US010366771B2

(12) United States Patent
Takizawa et al.

(10) Patent No.: US 10,366,771 B2
(45) Date of Patent: Jul. 30, 2019

(54) CONTROLLER, MEMORY SYSTEM, AND BLOCK MANAGEMENT METHOD FOR NAND FLASH MEMORY USING THE SAME

(71) Applicant: Toshiba Memory Corporation, Minato-ku (JP)

(72) Inventors: Kazutaka Takizawa, Yokohama (JP); Masaaki Niijima, Machida (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/703,747

(22) Filed: Sep. 13, 2017

(65) Prior Publication Data

US 2018/0247696 A1     Aug. 30, 2018

(30) Foreign Application Priority Data

Feb. 28, 2017 (JP) ................................ 2017-036941

(51) Int. Cl.
*G11C 16/34*     (2006.01)
*G06F 11/30*     (2006.01)
*G06F 12/02*     (2006.01)
*G06F 16/18*     (2019.01)
*G11C 16/10*     (2006.01)
(Continued)

(52) U.S. Cl.
CPC ...... *G11C 16/3495* (2013.01); *G06F 11/3037* (2013.01); *G06F 11/3055* (2013.01); *G06F 12/0246* (2013.01); *G06F 16/1847* (2019.01); *G11C 16/10* (2013.01); *G11C 16/16* (2013.01); *G11C 16/32* (2013.01); *G06F 2212/7211* (2013.01)

(58) Field of Classification Search
CPC ..... G11C 16/3495; G11C 16/10; G11C 16/32; G11C 16/16; G06F 16/1847; G06F 11/3037; G06F 11/3055; G06F 12/0246; G06F 2212/7211
See application file for complete search history.

(56) References Cited

U.S. PATENT DOCUMENTS 5,737,742 A * 4/1998 Achiwa ................ G06F 12/023
                                                          365/189.09
5,844,841 A   12/1998 Takeuchi et al.
6,930,925 B2   8/2005 Guo et al.
(Continued)

FOREIGN PATENT DOCUMENTS

JP     2001-357683     12/2001
JP     2008-276832     11/2008
(Continued)

*Primary Examiner* — Mushfique Siddique
(74) *Attorney, Agent, or Firm* — Oblon, McClelland, Maier & Neustadt, L.L.P.

(57) ABSTRACT

Aspects of the present disclosure include a memory system monitors at least one of an erasing time length and a programming time length of each of physical blocks included in a first logical block among a plurality of logical blocks. The memory system disassembles the first logical block among the plurality of logical blocks when both of a first physical block and a second physical block exist in the first logical block, the first physical block having an erasing time length or a programming time length falling within a first range, and the second physical block having an erasing time length or a programming time length falling outside the first range.

14 Claims, 28 Drawing Sheets

(51) Int. Cl.
*G11C 16/16* (2006.01)
*G11C 16/32* (2006.01)

(56) References Cited

U.S. PATENT DOCUMENTS

| | | | |
|---|---|---|---|
| 8,347,024 B2 | 1/2013 | Sato | |
| 8,566,513 B2 | 10/2013 | Yamashita | |
| 8,570,802 B2 | 10/2013 | Shirakawa | |
| 8,713,066 B1* | 4/2014 | Lo | G06F 12/0246 707/673 |
| 8,755,233 B2 | 6/2014 | Nagashima | |
| 8,824,212 B2 | 9/2014 | Lue | |
| 8,867,271 B2 | 10/2014 | Li et al. | |
| 9,064,580 B2 | 6/2015 | Senoo et al. | |
| 9,142,298 B2 | 9/2015 | Dong et al. | |
| 9,142,302 B2 | 9/2015 | Dong et al. | |
| 9,165,665 B2 | 10/2015 | Nagashima | |
| 2010/0169553 A1* | 7/2010 | Yano | G06F 12/0246 711/103 |
| 2011/0078402 A1* | 3/2011 | Sato | G06F 12/0246 711/166 |
| 2011/0191521 A1* | 8/2011 | Araki | G06F 12/0246 711/103 |
| 2011/0228605 A1 | 9/2011 | Suzuki et al. | |
| 2011/0238897 A1 | 9/2011 | Abe | |
| 2011/0283053 A1 | 11/2011 | Yamashita | |
| 2012/0243329 A1* | 9/2012 | Nagashima | G11C 16/10 365/185.22 |
| 2012/0265928 A1 | 10/2012 | Mun et al. | |
| 2012/0281478 A1 | 11/2012 | Lue et al. | |
| 2012/0281481 A1 | 11/2012 | Lue et al. | |
| 2012/0327719 A1 | 12/2012 | Lue | |
| 2013/0044544 A1 | 2/2013 | Shiino et al. | |
| 2013/0100743 A1 | 4/2013 | Lue | |
| 2013/0176783 A1 | 7/2013 | Senoo et al. | |
| 2014/0006689 A1* | 1/2014 | Hashimoto | G06F 12/0246 711/103 |
| 2014/0181376 A1* | 6/2014 | Miyamoto | G06F 12/0246 711/103 |
| 2014/0226406 A1 | 8/2014 | Dong et al. | |
| 2015/0067415 A1* | 3/2015 | Miyamoto | G06F 11/076 714/704 |
| 2015/0074333 A1* | 3/2015 | Yao | G06F 12/0246 711/103 |
| 2015/0186055 A1* | 7/2015 | Darragh | G06F 3/0616 711/103 |
| 2016/0004464 A1* | 1/2016 | Shen | G06F 3/0619 711/103 |
| 2016/0148691 A1 | 5/2016 | Rabkin et al. | |
| 2016/0321010 A1* | 11/2016 | Hashimoto | G06F 12/0246 |

FOREIGN PATENT DOCUMENTS

| | | |
|---|---|---|
| JP | 2011-70346 | 4/2011 |
| JP | 2011-198409 | 10/2011 |
| JP | 2011-198433 | 10/2011 |
| JP | 2011-258182 | 12/2011 |
| JP | 2012-1495 | 1/2012 |
| JP | 2012-203692 | 10/2012 |
| JP | 2012-226822 | 11/2012 |
| JP | 2012-238363 | 12/2012 |
| JP | 2012-238371 | 12/2012 |
| JP | 2013-41654 | 2/2013 |
| JP | 2013-143155 | 7/2013 |
| JP | 2014-26511 | 2/2014 |
| JP | 2014-132512 | 7/2014 |
| JP | 5542737 B2 | 7/2014 |
| JP | 5784788 B2 | 9/2015 |
| WO | WO 2004/093090 A1 | 10/2004 |
| WO | WO 2011/103013 A1 | 8/2011 |

* cited by examiner

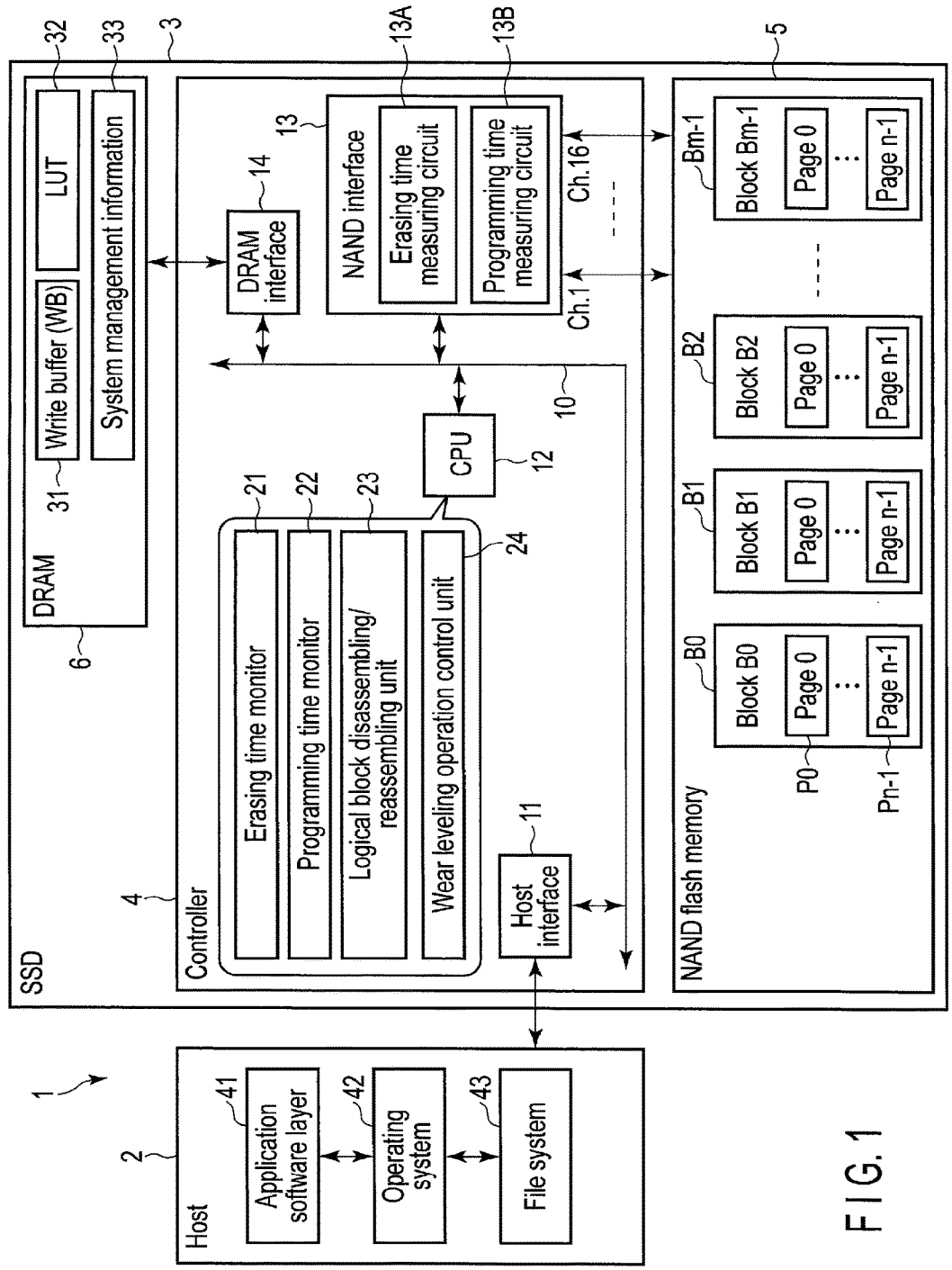
F I G. 1

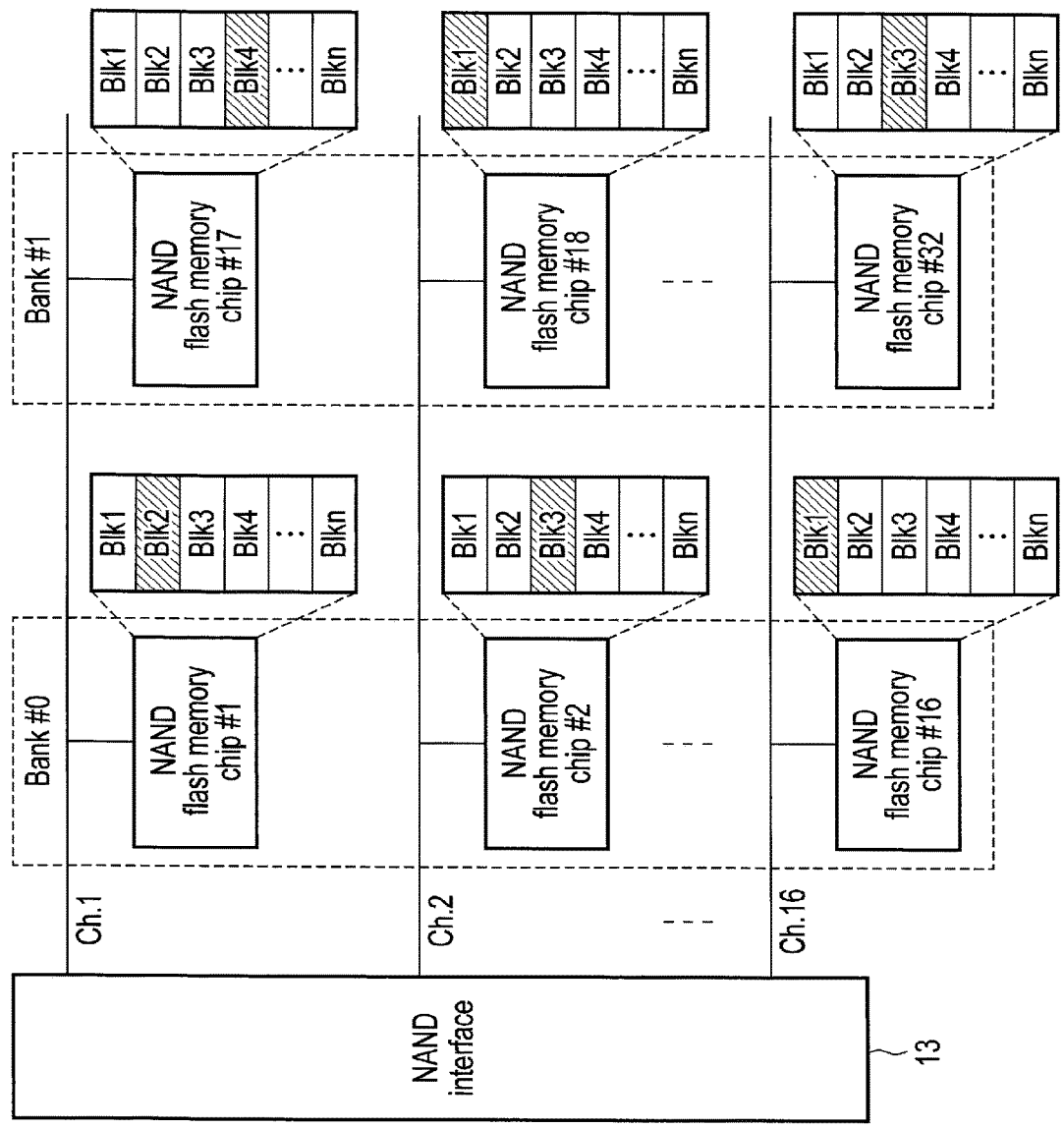
F I G. 2

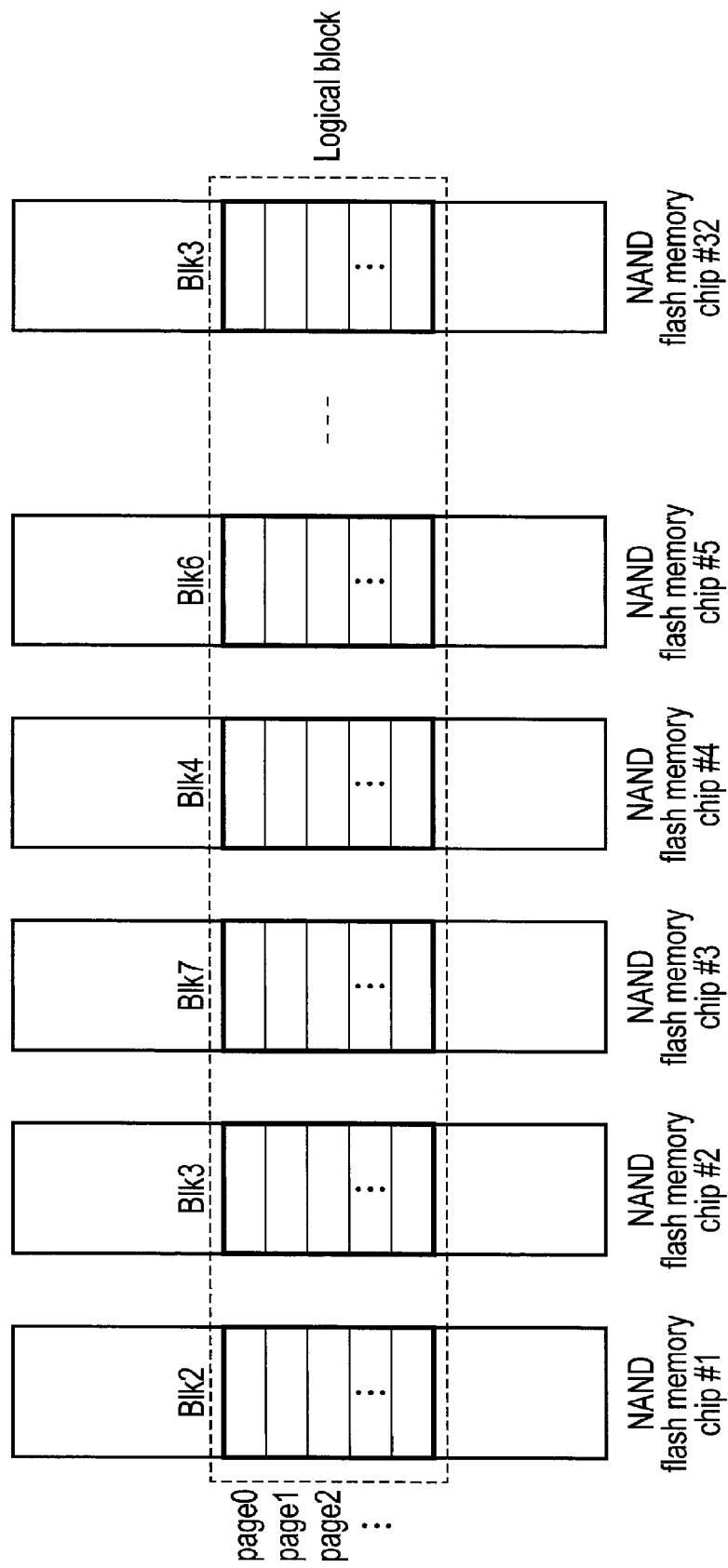
F I G. 3

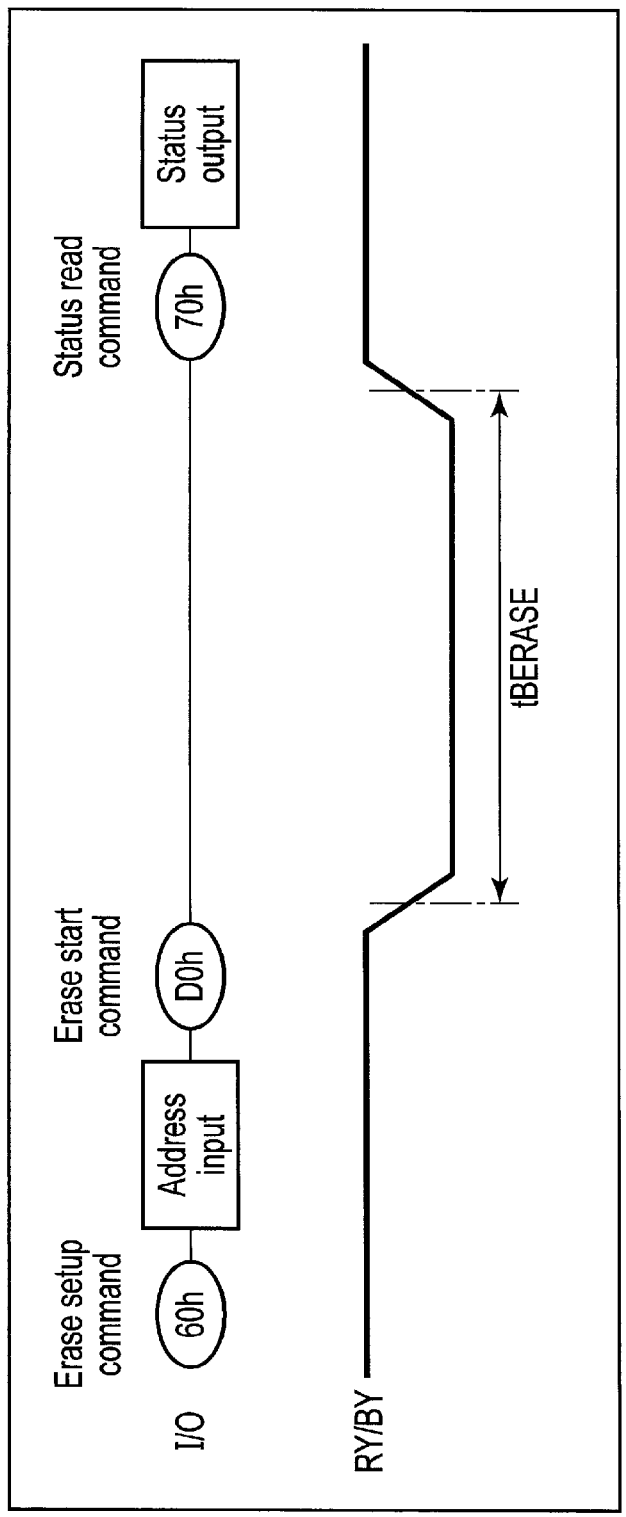
F I G. 4

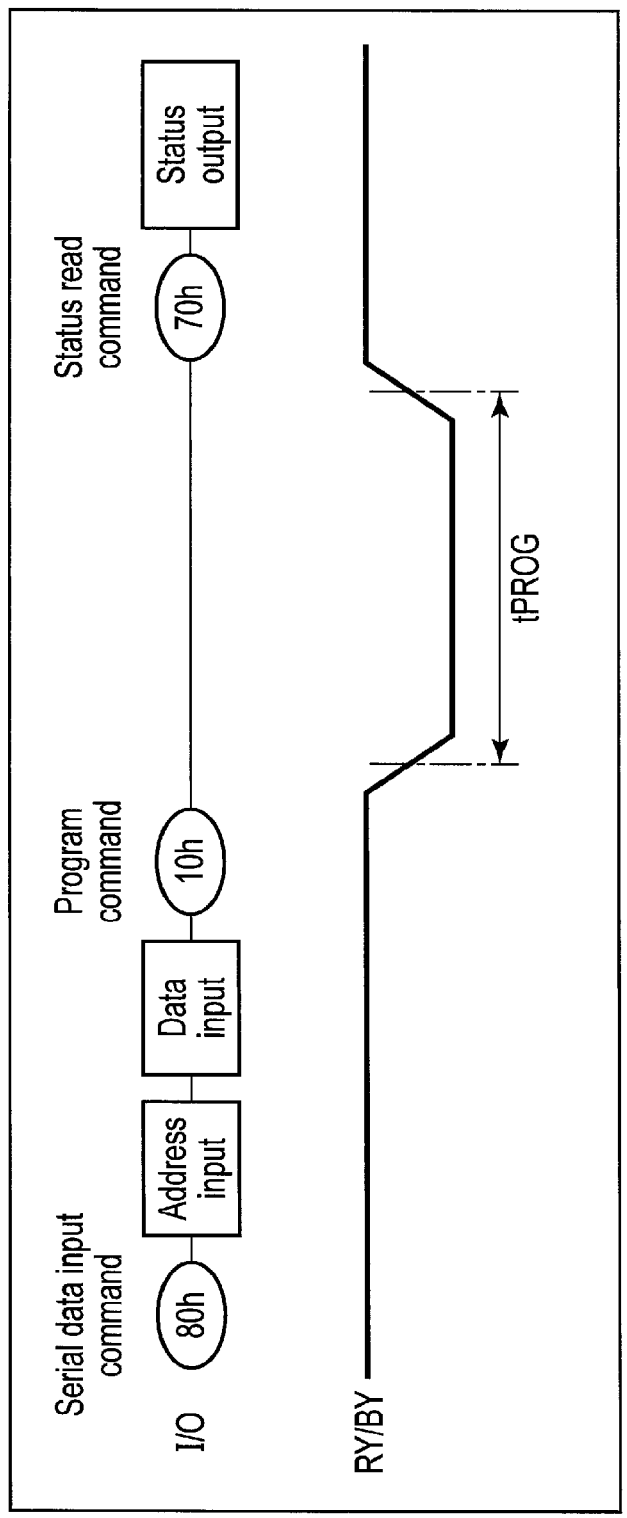
F I G. 5

Logical block management table

| Logical block ID | Physical block ID#1 | Physical block ID#2 | Physical block ID#3 | ... | Physical block ID#17 | Physical block ID#18 | Physical block ID#19 | ... |
|---|---|---|---|---|---|---|---|---|
| #1 | (Chip1, Blk2) | (Chip2, Blk3) | (Chip3, Blk7) | ... | (Chip17, Blk4) | (Chip18, Blk1) | (Chip19, Blk6) | ... |
| #2 | (Chip1, Blk3) | (Chip2, Blk1) | (Chip3, Blk3) | ... | (Chip17, Blk5) | (Chip18, Blk5) | (Chip19, Blk7) | ... |
| #3 | (Chip1, Blk5) | (Chip2, Blk2) | (Chip3, Blk6) | ... | (Chip17, Blk3) | (Chip18, Blk3) | (Chip19, Blk4) | ... |
| #4 | (Chip1, Blk6) | (Chip2, Blk6) | (Chip3, Blk8) | ... | (Chip17, Blk1) | (Chip18, Blk2) | (Chip19, Blk3) | ... |
| #5 | (Chip1, Blk4) | (Chip2, Blk4) | (Chip3, Blk1) | ... | (Chip17, Blk7) | (Chip18, Blk8) | (Chip19, Blk2) | ... |
| #6 | (Chip1, Blk4) | (Chip2, Blk5) | (Chip3, Blk4) | ... | (Chip17, Blk8) | (Chip18, Blk8) | (Chip19, Blk1) | ... |
| ... | ... | ... | ... | ... | ... | ... | ... | ... |

33A ch1 — bk0 — ch2 — bk0 — ch3 ⎫ bk0
ch1 — ch2 — ch3 ⎬ bk1

Logical block #1 ch1: Blk2 (Chip1), Blk4 (Chip17)
ch2: Blk3 (Chip2), Blk1 (Chip18)
ch3: Blk7 (Chip3), Blk6 (Chip19)

F I G. 6

33B  Physical block erasing time table

| Physical block ID | tBERASE(msec) |
| --- | --- |
| (Chip1, Blk1) | 2.5 |
| (Chip1, Blk2) | 2.7 |
| (Chip1, Blk3) | 2.6 |
| (Chip1, Blk4) | 5.0 |
| ⋮ | ⋮ |

F I G. 7

33C  Logical block erasing time table

| Logical block ID | tBERASE (msec)<br>(for example, average tBERASE or maximum tBERASE) |
| --- | --- |
| #1 | 2.6 |
| #2 | 2.5 |
| #3 | 2.7 |
| #4 | 2.8 |
| ⋮ | ⋮ |

F I G. 8

33D
Physical block erase count table

| Physical block ID | P/E cycles |
|---|---|
| (Chip1, Blk1) | 100 |
| (Chip1, Blk2) | 105 |
| (Chip1, Blk3) | 103 |
| (Chip1, Blk4) | 99 |
| ⋮ | ⋮ |

F I G. 9

33E
Logical block erase count table

| Logical block ID | P/E cycles (for example, average number of P/E cycles or maximum number of P/E cycles) |
|---|---|
| #1 | 101 |
| #2 | 103 |
| #3 | 101 |
| #4 | 100 |
| ⋮ | ⋮ |

F I G. 10

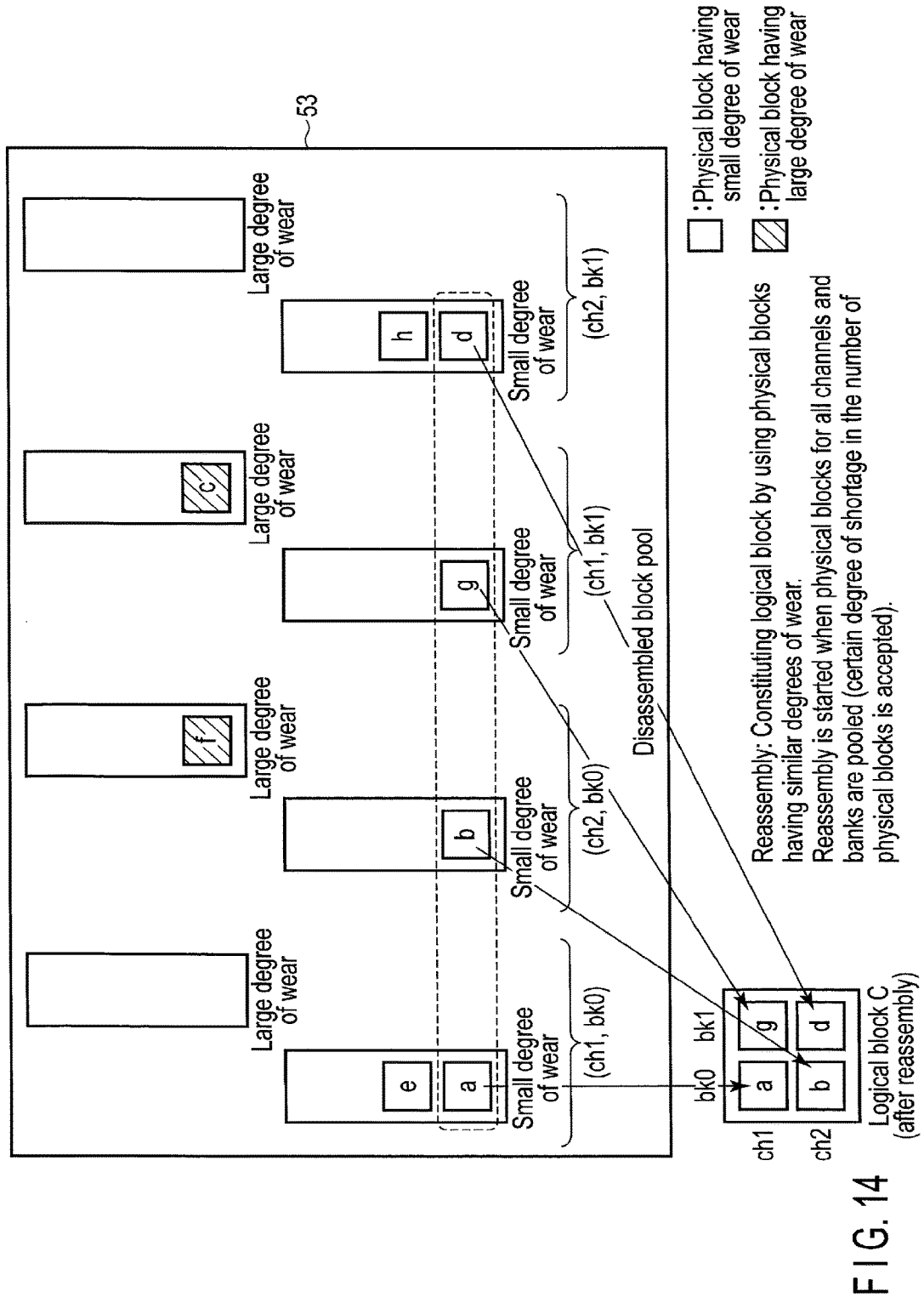
F I G. 14

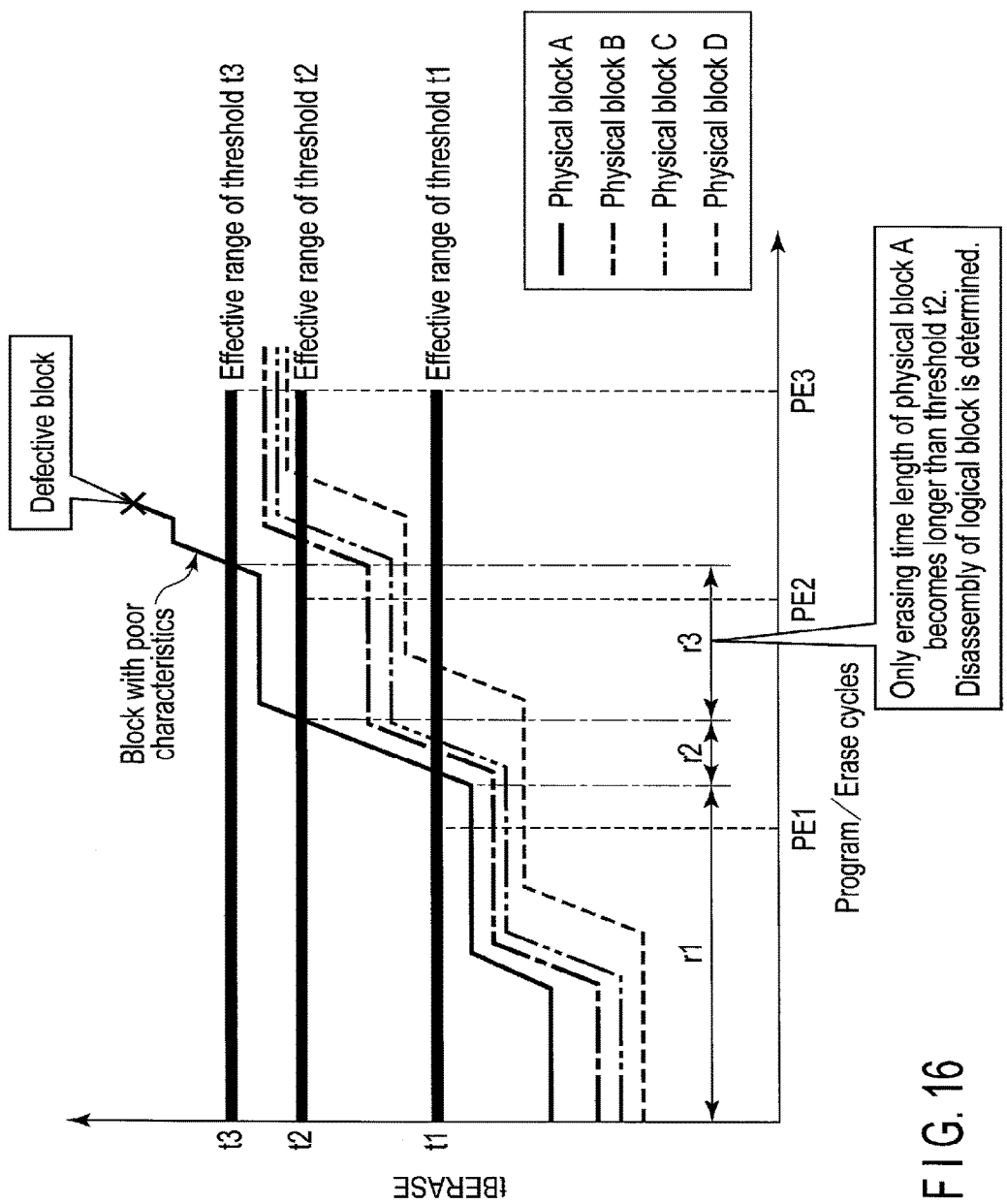
F I G. 16

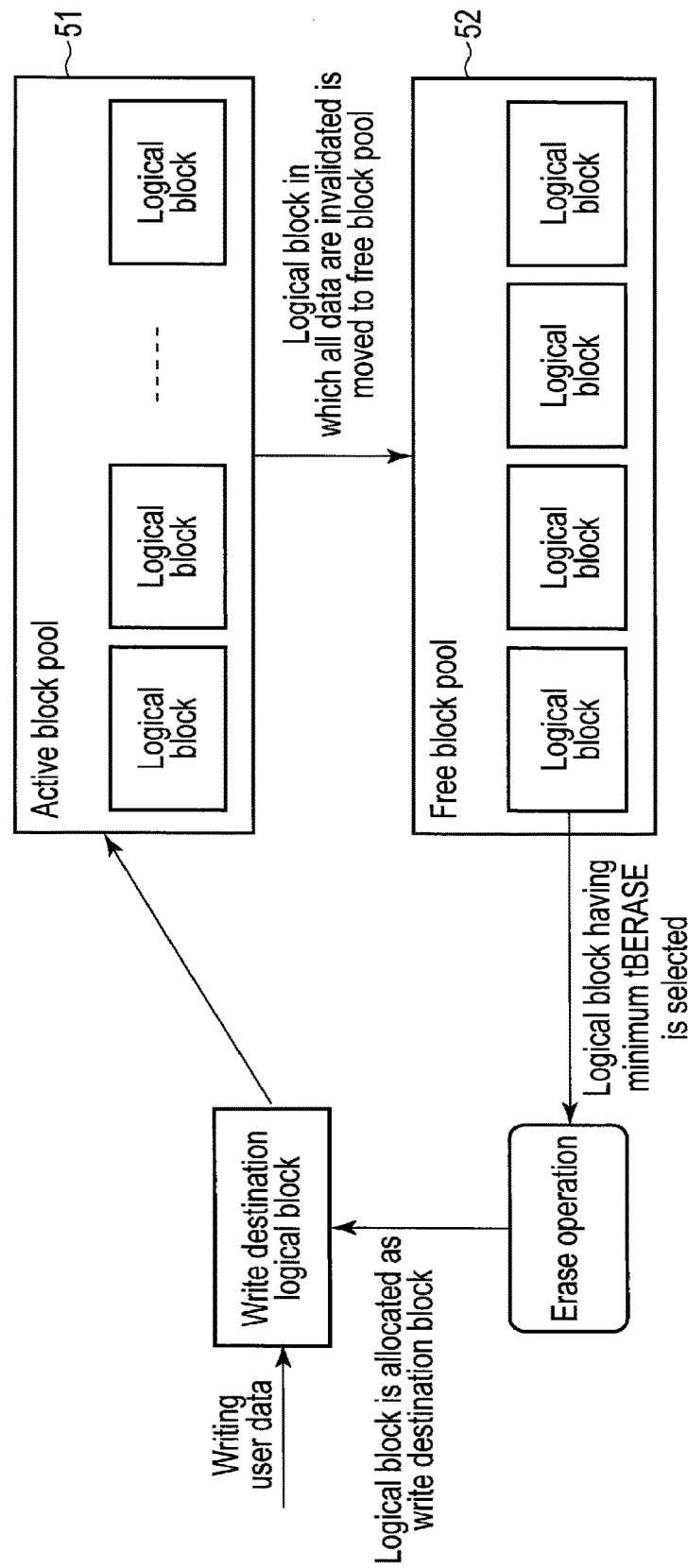
F I G. 18

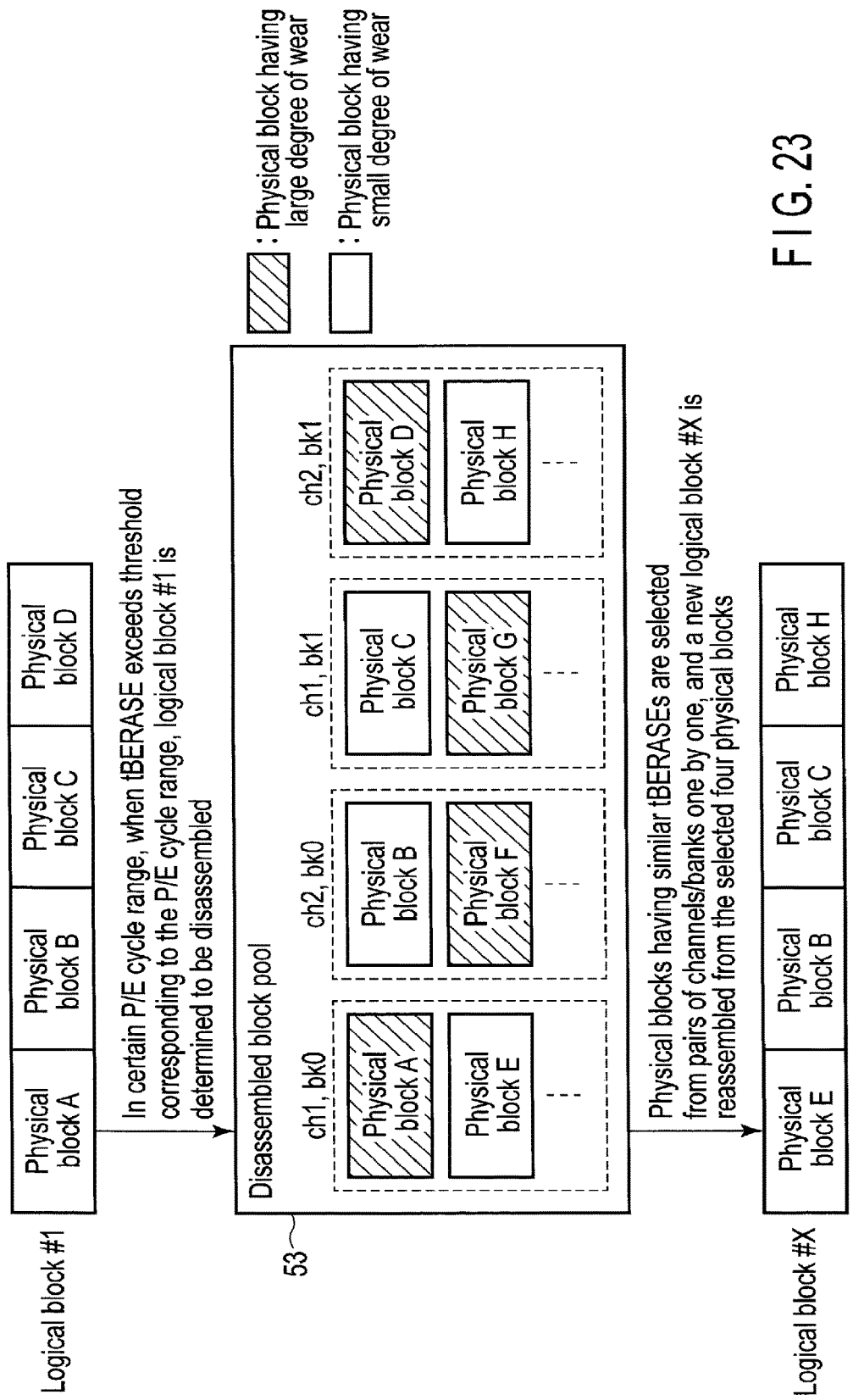
F I G. 23

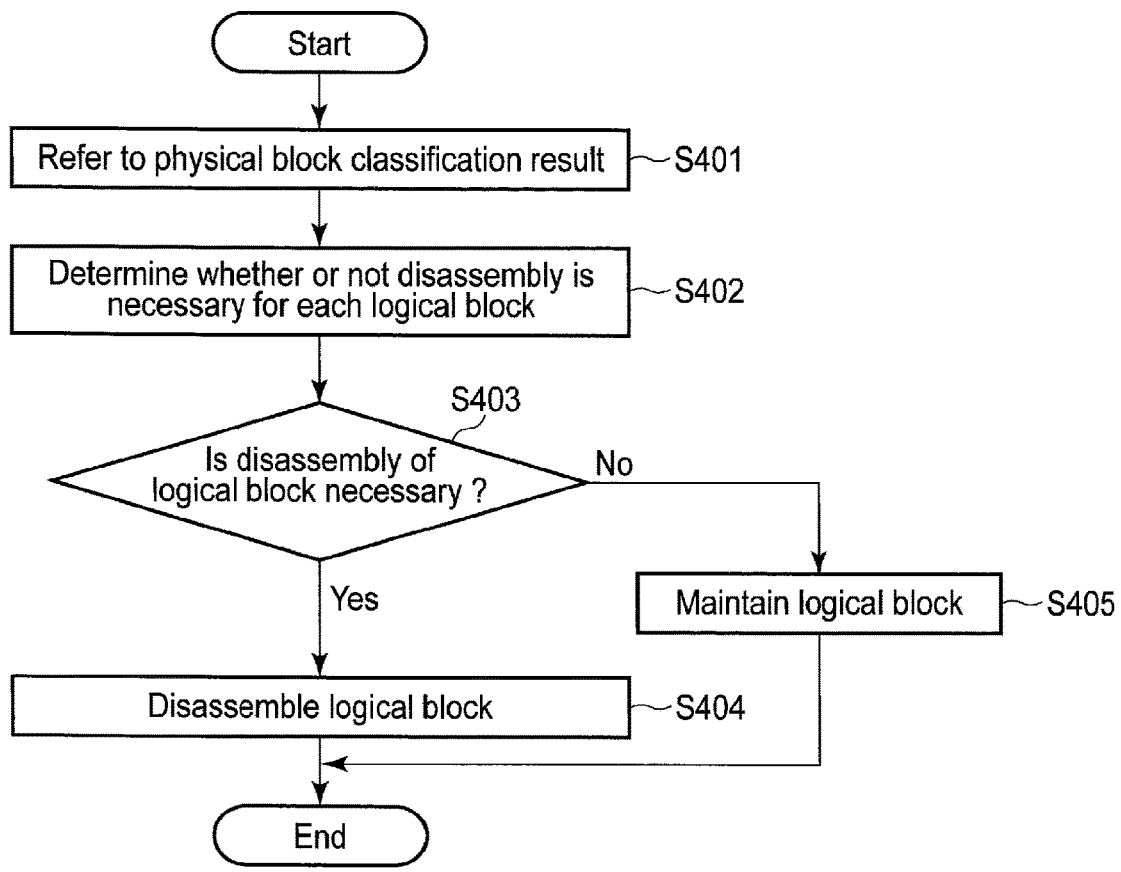
F I G. 25

33F Physical block programming time table

| Physical block ID | tPROG($\mu$sec) |
|---|---|
| (Chip1, Blk1) | 300 |
| (Chip1, Blk2) | 320 |
| (Chip1, Blk3) | 310 |
| (Chip1, Blk4) | 600 |
| ⋮ | ⋮ |

F I G. 27

33G Logical block programming time table

| Logical block ID | tPROG ($\mu$sec)(for example, average tPROG or minimum tPROG) |
|---|---|
| #1 | 330 |
| #2 | 330 |
| #3 | 340 |
| #4 | 360 |
| ⋮ | ⋮ |

F I G. 28

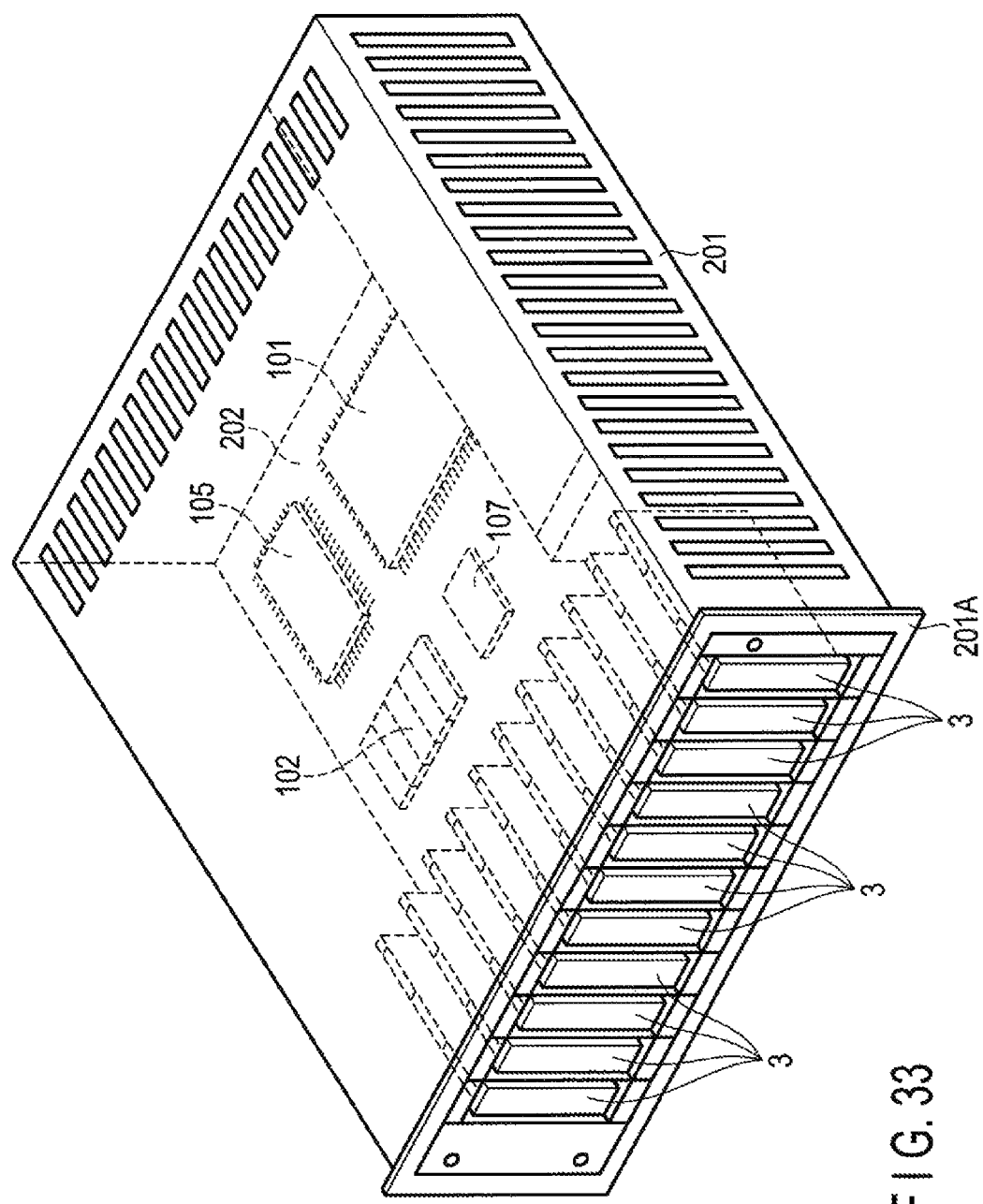
F I G. 33

CONTROLLER, MEMORY SYSTEM, AND BLOCK MANAGEMENT METHOD FOR NAND FLASH MEMORY USING THE SAME

CROSS-REFERENCE TO RELATED APPLICATIONS

This application is based upon and claims the benefit of priority from Japanese Patent Application No. 2017-036941, filed Feb. 28, 2017, the entire contents of which are incorporated herein by reference.

FIELD

Embodiments described herein relate generally to a memory system comprising a nonvolatile memory.

BACKGROUND

In recent years, memory systems comprising nonvolatile memories are widely prevailing.

As one of such memory systems, a solid state drive (SSD) provided with a NAND flash memory is known. SSDs are used as main storages of various computing devices.

In the NAND flash memory, wear in the tunnel oxide films of memory cells may occur due to repetitive application of a programming voltage or an erasing voltage to each of these memory cells. Due to wear in the memory cell (wear in the tunnel oxide film), there is a possibility that a program operation or an erase operation on the NAND flash memory fails.

For example, when an erase operation of a certain physical block in the NAND flash memory is unsuccessful, a fail status indicating a failure in the erase operation is notified by the NAND flash memory to a controller in the SSD. In this case, in the SSD, this physical block may be treated as an unusable defective block (i.e., bad block).

However, when the number of physical blocks treated as bad blocks increases, the total physical capacity of the SSD is reduced. As a result, a capacity of the SSD which can be utilized as a spare area (over-provision) is reduced, and thus the performance and reliability of the SSD also deteriorate. If the total physical capacity falls below the user capacity due to a further increase in the number of bad blocks, it becomes impossible for the SSD to serve as storage. Accordingly, the increase in the number of physical blocks treated as bad blocks constitutes a factor shortening the life of the SSD.

SUMMARY

Aspects of the disclosure provide a memory system that includes a nonvolatile memory and a controller circuit electrically connected to the nonvolatile memory. The nonvolatile memory includes a plurality of physical blocks. The controller circuit is configured to manage a plurality of logical blocks each of which includes a respective set of physical blocks among the plurality of physical blocks, and execute an erase operation in units of logical blocks. In some embodiments, the controller circuit is configured to monitor at least one of an erasing time length and a programming time length of each of physical blocks included in a first logical block among the plurality of logical blocks, and disassemble the first logical block among the plurality of logical blocks when both of a first physical block and a second physical block exist in the first logical block. The first physical block has an erasing time length or a programming time length falling within a first range, and the second physical block has an erasing time length or a programming time length falling outside the first range.

BRIEF DESCRIPTION OF THE DRAWINGS

FIG. 1 is a block diagram illustrating a configuration example of a memory system according to a first embodiment.

FIG. 2 is a block diagram illustrating relationships between a NAND interface and a plurality of NAND flash memory chips in the memory system of the first embodiment.

FIG. 3 is view illustrating a configuration example of a logical block used in the memory system of the first embodiment.

FIG. 4 is a timing chart illustrating a sequence of an erase operation which is executed by the NAND interface in the memory system of the first embodiment.

FIG. 5 is a timing chart illustrating a sequence of a write operation which is executed by the NAND interface in the memory system of the first embodiment.

FIG. 6 is a view illustrating a logical block management table which is managed by the memory system of the first embodiment.

FIG. 7 is a view illustrating a physical block erasing time table which is managed by the memory system of the first embodiment.

FIG. 8 is a view illustrating a logical block erasing time table which is managed by the memory system of the first embodiment.

FIG. 9 is a view illustrating a physical block erase count table which is managed by the memory system of the first embodiment.

FIG. 10 is a view illustrating a logical block erase count table which is managed by the memory system of the first embodiment.

FIG. 14 is a view for explaining an algorithm for reassembly of a logical block which is executed by the memory system of the first embodiment.

FIG. 16 is a view for explaining relationships between an erase count and an erasing time length of each of the physical blocks included in the same logical block, and a logical block disassembling condition used in the first embodiment.

FIG. 18 is a view illustrating a dynamic wear leveling operation which is executed by the memory system of the first embodiment.

FIG. 23 is a view illustrating a logical block disassembling operation and a logical block reassembling operation, the operations being executed by the memory system of the second embodiment.

FIG. 25 is a flowchart illustrating a procedure for a logical block disassembling operation which is executed by the memory system of the second embodiment.

FIG. 27 is a view for explaining a physical block programming time table which is managed by the memory system of the third embodiment.

FIG. 28 is a view for explaining a logical block programming time table which is managed by the memory system of the third embodiment.

FIG. 33 is a view illustrating a configuration example of a computer including a host and memory system of the first, second or third embodiment.

DETAILED DESCRIPTION

Figure 11:
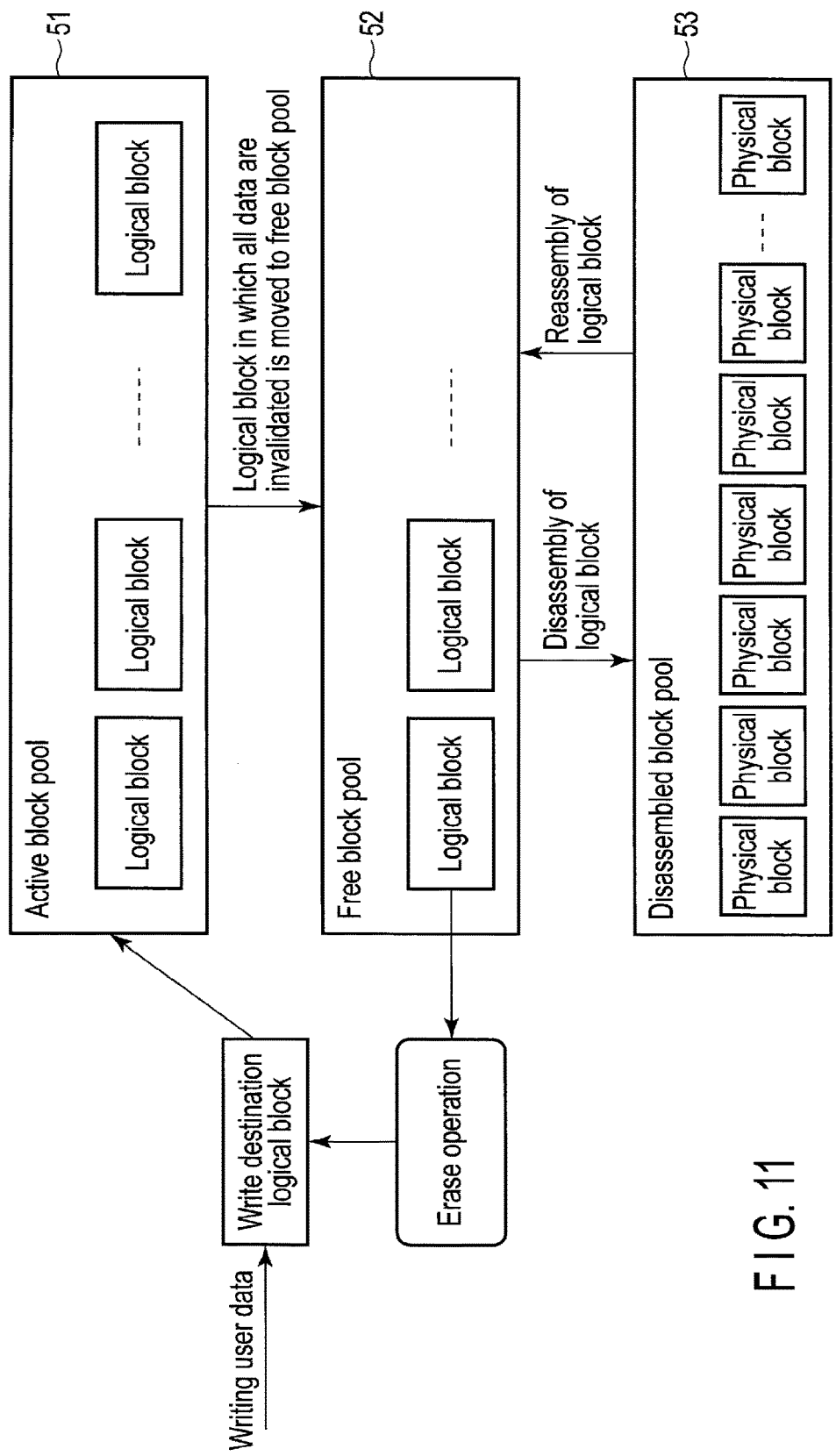
FIG. 11 is a view illustrating relationships between an active block pool, free block pool, and disassembled block pool which are managed by the memory system of the first embodiment.

Various embodiments will be described hereinafter with reference to the accompanying drawings.

In general, according to one embodiment, a memory system comprises a nonvolatile memory and a controller circuit. The nonvolatile memory includes a plurality of physical blocks. The controller circuit is electrically connected to the nonvolatile memory, and is configured to manage a plurality logical blocks each of which includes a set of physical blocks among the plurality of physical blocks, and execute an erase operation in units of logical blocks.

The controller circuit is configured to monitor at least one of an erasing time length and a programming time length of each of physical blocks included in a logical block among the plurality of logical blocks.

The controller circuit disassembles a first logical block among the plurality of logical blocks when both of a first physical block and a second physical block exist in the first logical block, the first physical block having an erasing time length or a programming time length falling within a first range specified by a first threshold value, and the second physical block having an erasing time length or a programming time length falling outside the first range.

First Embodiment

First, a configuration of an information processing system 1 including a memory system according to a first embodiment will be described below with reference to FIG. 1.

This memory system is a semiconductor storage device configured to write data to a nonvolatile memory, and read data from the nonvolatile memory. This memory system is realized as, for example, a solid state drive (SSD) 3 provided with a NAND flash memory.

The information processing system 1 includes a host (host device) 2 and SSD 3. The host 2 is an information processing device (computing device) configured to access the SSD 3. The host 2 may be a storage server (server) configured to store a large amount of various types of data in the SSD 3 or may be a personal computer.

The SSD 3 can be used as a main storage of the information processing device (computing device) functioning as the host 2. The SSD 3 may be incorporated in the information processing device or may be connected to the information processing device through a cable or network.

As an interface configured to interconnect the host 2 and the SSD 3, SCSI, Serial Attached SCSI (SAS), ATA, Serial ATA (SATA), PCI Express (PCIe) (registered trade mark), Ethernet (registered trade mark), Fibre channel, NVM Express (NVMe) (registered trade mark), and the like can be used.

The SSD 3 includes a controller (controller circuit) 4 and a nonvolatile memory (NAND flash memory) 5. The SSD 3 may also include a random access memory, for example, a DRAM 6.

The NAND flash memory 5 includes a memory cell array including a plurality of memory cells arranged in a matrix form. The NAND flash memory 5 may be a NAND flash memory having a two-dimensional structure or may be a NAND flash memory having a three-dimensional structure.

The memory cell array of the NAND flash memory 5 includes a plurality of physical blocks B0 to Bm−1. Each of the physical blocks B0 to Bm−1 is constituted of a plurality of pages (here, page P0 to Pn−1). Each of the physical blocks B0 to Bm−1 functions as an addressable smallest erase unit. A physical block is also called a "erase block", "physical erase block" or is simply called a "block" in some cases. Each of the pages P0 to Pn−1 includes a plurality of memory cells connected to the same word line. The pages P0 to Pn−1 are units of a data write operation and data read operation.

Each of the physical blocks B0 to Bm−1 has a limited erasable count. The erase count may also be expressed by the number of program/erase cycles. One program/erase cycle of a certain physical block includes an erase operation for bringing all the memory cells in the physical block to an erased state, and a write operation (program operation) of writing data to each of pages of this physical block. Since each of the physical blocks B0 to Bm−1 has a limited erasable count (limited program/erase cycles), and it is desirable that the numbers of program/erase cycles of the physical blocks B0 to Bm−1 be leveled as much as possible.

In this embodiment, the controller 4 manages a plurality of logical blocks each of which includes a set of physical blocks, and executes an erase operation in units of logical blocks. Accordingly, a logical block actually functions as an erase unit. Thus, it is possible to make erase counts of physical blocks included in the same logical block identical to each other.

The controller 4 is electrically connected to the NAND flash memory 5 which is a nonvolatile memory through a NAND interface 13 such as a Toggle, Open NAND Flash Interface (ONFI). The NAND interface 13 functions as a NAND control circuit configured to control the NAND flash memory 5.

The NAND flash memory 5 includes a plurality of NAND flash memory chips as shown in FIG. 2. The individual NAND flash memory chips can operate independently of each other. Accordingly, the NAND flash memory chips function as units capable of operating in parallel with each other. In FIG. 2, a case where 16 channels Ch. 1 to Ch. 16 are connected to the NAND interface 13, and two NAND flash memory chips are connected to each of the 16 channels Ch. 1 to Ch. 16 is exemplified. In this case, the 16 NAND flash memory chips #1 to #16 connected to the channels Ch. 1 to Ch. 16 may be organized into a bank #0, and the remaining 16 NAND flash memory chips #17 to #32 connected to the channels Ch. 1 to Ch. 16 may be organized into a bank #1. A bank functions as a unit for making a plurality of memory modules operate in parallel with each other by bank interleaving. In the configuration example of FIG. 2, by the 16 channels and the bank interleaving using two banks, it is possible to make a maximum number of 32 NAND flash memory chips operate in parallel with each other.

One logical block may include 32 physical blocks each of which is selected from each of the NAND flash memory chips #1 to #32 one by one, although it is not limited to it. In FIG. 2, the physical blocks indicated by hatching indicate physical blocks included in one logical block. The NAND flash memory chips can be distinguished from each other by a channel number and bank number. Further, the physical blocks can be distinguished from each other by a chip number and intra-chip physical block number.

It should be noticed that each of the NAND flash memory chips #1 to #32 may have a multi-plane configuration. For example, when each of the NAND flash memory chips #1 to #32 has a multi-plane configuration including two planes, one logical block may include 64 physical blocks each of which is selected one by one from each of 64 planes corresponding to the NAND flash memory chips #1 to #32.

Here, as illustrated in FIG. 3, a case where a certain logical block includes 32 physical blocks (a physical block Blk2 in a NAND flash memory chip #1, a physical block Blk3 in a NAND flash memory chip #2, a physical block Blk7 in a NAND flash memory chip #3, a physical block Blk4 in a NAND flash memory chip #4, a physical block Blk6 in a NAND flash memory chip #5, . . . a physical block Blk3 in a NAND flash memory chip #32) is assumed.

As described above, the controller 4 executes an erase operation in units of logical blocks. Accordingly, erase operations of these 32 physical blocks included in the same logical block are executed in parallel with each other.

Further, in writing data to the logical block, the controller 4 may write data to page0 of the physical block Blk2 in the NAND flash memory chip #1, page0 of the physical block Blk3 in the NAND flash memory chip #2, page0 of the physical block Blk7 in the NAND flash memory chip #3, page0 of the physical block Blk4 in the NAND flash memory chip #4, page0 of the physical block Blk6 in the NAND flash memory chip #5, . . . page0 of the physical block Blk3 in the NAND flash memory chip #32 in the order mentioned. Thereby, write operations of data to a maximum of 32 pages can be executed in parallel with each other. Further, in reading data from the logical block too, operations of reading data from a maximum of 32 pages can be executed in parallel with each other.

Next, a configuration of the controller 4 of FIG. 1 will be described below.

The controller 4 is electrically connected to a plurality of NAND flash memory chips through a plurality of channels (for example, 16 channels). The controller 4 controls the NAND flash memory 5 (a plurality of NAND flash memory chips).

The controller 4 may function as a flash translation layer (FTL) configured to execute data management and block management of the NAND flash memory 5. The data management to be executed by the FTL includes, (1) management of mapping information indicating a correspondence relationship between logical addresses and physical addresses of the NAND flash memory 5, (2) processing for concealing read/write operations performed in units of pages and an erase operations performed in units of logical blocks, and the like. The logical address is an address used by the host to address the SSD 3. As the logical address, LBA (a logical block address (addressing)) can be used.

The management of mapping between the logical addresses and the physical addresses is executed by using a look-up table (LUT) 32 functioning as an address translation table (logical-to-physical address translation table). The controller 4 uses the look-up table (LUT) 32 to manage the mapping between the logical addresses and the physical addresses in units of predetermined management sizes. A physical address corresponding to a certain logical address indicates the latest physical location in the NAND flash memory 5 where data related to the certain logical address is written. The address translation table (LUT 32) may be loaded from the NAND flash memory 5 into the DRAM 6 at power-on of the SSD 3.

Data write to a page can be carried out only once per erase cycle. For this reason, the controller 4 writes update data corresponding to a certain logical address not to a physical location at which previous data corresponding to this logical address is stored but to another physical location. Further, the controller 4 updates the look-up table (LUT) 32 to associate this logical address with this another physical location, and invalidates the previous data.

The block management includes, management of bad blocks, wear leveling, garbage collection, and the like. Wear leveling is an operation for leveling wear in the physical blocks. In the garbage collection, in order to increase the number of free blocks (free logical blocks) to which data can be written, the controller 4 moves valid data in several target blocks (several target logical blocks) each of which stores a mixture of the valid data and invalid data to another block (for example, free logical block). Here, the valid data means data which is referred to from the LUT 32 (i.e., data linked to a logical address as the latest data) and may subsequently be read by the host 2. The invalid data means data which no longer has a possibility of being read by the host 2. For example, data associated with a certain logical address is valid data, and data associated with no logical address is invalid data.

Further, the controller 4 updates the look-up table (LUT) 32 to associate the logical addresses of the moved valid data with the physical addresses of the destinations of the movement. The block (logical block) which now stores only invalid data due to the movement of the valid data to other blocks is released as a free block (free logical block). Consequently, the logical block can be reused after an erase operation is performed on the logical block.

The controller 4 may include a host interface 11, CPU 12, NAND interface 13, DRAM interface 14, and the like. The CPU 12, NAND interface 13, and DRAM interface 14 may be inter-connected through a bus 10.

The host interface 11 receives various commands (for example, a write command, read command, UNMAP/Trim command, and the like) from the host 2.

The CPU 12 is a processor configured to control the host interface 11, NAND interface 13, and DRAM interface 14. In response to power-on of the SSD 3, the CPU 12 loads a control program (firmware) stored in the NAND flash memory 5 into the DRAM 6, and executes the firmware to thereby carry out various types of processing. The CPU 12 can execute, in addition to the processing of the FTL described above, for example, command processing for processing various commands received from the host 2. The operation of the CPU 12 is controlled by the aforementioned firmware. It should be noted that A part or all of each of the FTL processing and command processing may be executed by dedicated hardware in the controller 4.

The CPU 12 can function as an erasing time monitor 21, programming time monitor 22, logical block disassembling/reassembling unit 23, and wear leveling operation control unit 24.

The erasing time monitor 21 monitors an erasing time length of each of physical blocks included in each of the aforementioned plurality of logical blocks managed by the controller 4. The erasing time length of a certain physical block means a period of time (tBERASE) required to complete an erase operation for the physical block. In this embodiment, an erase operation is executed in units of logical blocks. Therefore, when an erase operation for a certain logical block is executed, erase operations for all the physical blocks included in this logical block are executed in parallel with each other. Each of erasing time lengths of all the physical blocks is monitored by the erasing time monitor 21. The erasing time monitor 21 may obtain the erasing time length of each physical block from an erasing time measuring circuit 13A included in the NAND interface 13.

The timing chart of FIG. 4 illustrates an example of a sequence of an erase operation for a certain physical block in a certain NAND flash memory chip. The NAND interface 13 transmits an erase setup command "60h", address specifying a physical block to be subjected to the erase operation, and erase start command "D0h" to this NAND flash memory chip through an IO bus in a certain channel. Further, the NAND interface 13 monitors a ready/busy signal (RY/BY) of the NAND flash memory chip, and waits for the completion of the erase operation. While the erase operation of the physical block is executed in the NAND flash memory chip, the NAND flash memory chip is kept in the busy state. During the time period in which the NAND flash memory chip is in the busy state, the ready/busy signal (RY/BY) is kept at, for example, the low level. The erasing time measuring circuit 13A may measure the time length (tBERASE) for which the NAND flash memory chip is kept in the busy state due to the erase operation of the physical block as the erasing time length of the physical block. In this case, the erasing time measuring circuit 13A may measure the time length for which the ready/busy signal (RY/BY) is kept at the low level in the erase operation sequence, and notify the erasing time monitor 21 of the measured time length.

The NAND flash memory chip executes a verification operation for verifying whether or not the erase operation of the physical block is successful. The erase operation and the verification operation are repeated until the erase operation becomes successful or a loop number of the erase operation and the verification operation reaches a set maximum loop number. When the erase operation and the verification operation are completed, the NAND flash memory chip returns to the ready state. At this time, the ready/busy signal (RY/BY) returns, for example, from the low level to the high level. When the NAND flash memory chip returns to the ready state, the NAND interface 13 transmits a status read command "70h" to the NAND flash memory chip through the IO bus. When the erase operation is successful, a status (pass status) indicating the success is notified from the NAND flash memory chip to the NAND interface 13. On the other hand, when the erase operation is not successful, a status (fail status) indicating the failure is notified from the NAND flash memory chip to the NAND interface 13.

Alternatively, the controller 4 may measure the tBERASE without using the ready/busy signal (RY/BY). In this case, the controller 4 may measure the tBERASE by performing a polling operation to repetitively issue a status read command to the NAND flash memory chip during the erase operation.

The programming time monitor 22 of FIG. 1 monitors the programming time length for each of the physical blocks included in each of the aforementioned plurality of logical blocks. The programming time length of a certain physical block means a period of time (average programming time length) required to carry out an operation (program operation) of writing data to each page (or each word line) included in the physical block. Here, the programming time length to be monitored may be the average programming time length of all the pages included in the physical block or may be the average programming time length of some pages included in the physical block. Here, the pages taken as an object in order to calculate the average value of the programming time lengths may be a plurality of consecutive pages or may be a plurality of discontinuous pages. Alternatively, the programming time length to be monitored may be the average programming time length of all the word lines included in the physical block or may be the average programming time length of some word lines included in the physical block. For example, when a data write operation (program operation) for a certain page in the certain physical block is executed, the time length required to carry out the program operation for the page may be monitored by the programming time monitor 22. The programming time monitor 22 may obtain the programming time length from a programming time measuring circuit 13B included in the NAND interface 13.

It should be noticed that in the program operation, there is also a case where data is written to one memory cell through a plurality of stages (a plurality of programming stages). Examples of the plurality of programming stages include, (1) lower-page programming and upper-page programming in a page-by-page program operation in multi-level cells (MLC), and (2) a foggy-fine program operation or the like in triple-level cells (TLC) or quad-level cells (QLC).

Further, even in a full sequence program operation, when characteristics differ from word line to word line, the programming time length differs from word line to word line in some cases.

Accordingly, in the processing for obtaining the programming time length of each of the physical blocks, the controller 4 may classify the measured programming time lengths according to a variety of the programming steps, word lines, and the like, to thereby obtain the average programming time length for each of the programming stages, word lines, and the like.

The timing chart of FIG. 5 illustrates an example of a program operation sequence for a certain page in a certain physical block in a certain NAND flash memory chip. The NAND interface 13 transmits a serial data input command "80h", address specifying a physical block and page for which a program operation should be executed, data to be written, and programming start command "10h" to the NAND flash memory chip through an IO bus in a certain channel. Then, the NAND interface 13 monitors a ready/busy signal (RY/BY) of the NAND flash memory chip, and waits for the completion of the program operation. While the program operation is executed in the NAND flash memory chip, the NAND flash memory chip is kept in the busy state. The programming time measuring circuit 13B may measure the time length (tPROG) for which the NAND flash memory chip is kept in the busy state due to the program operation as the programming time length. In this case, the programming time measuring circuit 13B may measure the time length for which the ready/busy signal (RY/BY) is kept at the low level in the program operation sequence, and notify the programming time monitor 22 of the measured time length.

The NAND flash memory chip executes a verification operation for verifying whether or not the program operation is successful. The program operation and verification operation are repeated until the program operation becomes successful or a loop number of the program operation and verification operation reaches a set maximum loop number. When the program operation and verification operation are completed, the NAND flash memory chip returns to the ready state. When the NAND flash memory chip returns to the ready state, the NAND interface 13 transmits a status read command "70h" to the NAND flash memory chip through the IO bus. When the program operation is successful, a status (pass status) indicating the success is notified from the NAND flash memory chip to the NAND interface 13. On the other hand, when the program operation is not successful, a status (fail status) indicating the failure is notified from the NAND flash memory chip to the NAND interface 13.

The logical block disassembling/reassembling unit 23 of FIG. 1 determines for each logical block whether or not physical blocks having different degrees of wear are mixed in the logical block. More specifically, based on at least one of the erasing time length and the programming time length of each of physical blocks included in the logical block which is the object to be processed, the logical block disassembling/reassembling unit 23 determines whether or not a physical block having an erasing time length or a programming time length belonging to a certain set range, and other physical block having an erasing time length or a programming time length belonging to another set range exist in this logical block.

As the wear of a certain physical block proceeds, the erasing time length of this physical block tends to become longer. On the other hand, as the wear of a certain physical block proceeds, the programming time length (for example, average programming time length) of this physical block tends to become shorter.

The reason is that as the wear of the physical block proceeds, the deterioration of the tunnel oxide film (trap generation) of each of the memory cells in the physical block occurs. The deterioration of the tunnel oxide films (trap generation) causes an increase in an erasing loop number (i.e., the loop number of the erase and verification operations needed to be repeated until the erase operation is successful). Further, the deterioration of the tunnel oxide films (trap generation) also causes a decrease in a programming loop number (i.e., the loop number of the program and verification operations needed to be repeated until the program operation is successful). Accordingly, the erasing time length or the programming time length of a certain physical block can be an index indicating the degree of wear of this physical block. Further, instead of the erasing time length and programming time length, the erasing loop number and the programming loop number may be used. Further, a ratio of the erasing time length to the erasing loop number or a ratio of the programming time length to the programming loop number may be the wear degree index.

If a physical block with poor characteristics (physical block susceptible to wear) is included in a certain logical block, the physical block is worn earlier than other physical blocks in this logical block. As a result, the erasing time length of this physical block becomes longer than other physical blocks in this logical block. Likewise, the programming time length of this physical block becomes shorter than other physical blocks in this logical block.

As described above, there is a case where a physical block with poor characteristics (physical block susceptible to wear) is included in a set of physical blocks constituting one logical block, and physical blocks having different degrees of wear may exist in one logical block. When a logical bock in which physical blocks having different degrees of wear exist is continuously used, the wear of the physical block having a high degree of wear (i.e., physical block with poor characteristics) is tend to reach a limit value early, and it becomes impossible to normally execute the erase operation or program operation of this physical block. In this case, it is inevitable that this physical block is treated as an unusable defective block (i.e., bad block). As a result, reducing of the total physical capacity of the SSD 3, and furthermore, deterioration of the performance and reliability of the SSD 3 is brought about.

Thus, in this embodiment, if it is determined that a physical block having erasing time length or programming time length falling within a range specified by a certain set threshold value, and other physical block having erasing time length or programming time length falling outside this range exist in the logical block which is the object to be processed, the logical block disassembling/reassembling unit 23 disassembles this logical block. Then, the logical block disassembling/reassembling unit 23 reassembles a new logical block with a set of physical blocks having erasing time lengths belonging to a certain range or programming time lengths belonging to a certain range.

Here, disassembling a logical block means releasing each of physical blocks included in the logical block from this logical block. Further, reassembling a new logical block means newly creating a logical block including a set of physical blocks.

By the operation of the logical block disassembling/reassembling unit 23, it becomes possible to positively disassemble a logical block including a physical block with poor characteristics before this physical block actually becomes the bad block. By the positive disassembly of the logical block and reassembly of the new logical block, it becomes possible to make the degrees of wear of the physical blocks included in each logical block similar to each other. That is, by the disassembly of the logical block and reassembly of the new logical block, it becomes possible to make the degrees of wear (erasing time/programming time lengths or erasing loop numbers/programming loop numbers) of all the physical blocks, belonging to the same logical block, similar to each other. That is, each logical block can include physical blocks having erasing time/ programming time lengths similar to each other or erasing loop numbers/programming loop numbers similar to each other.

Accordingly, in this embodiment, it is possible to equalize the degrees of wear of all the physical blocks belonging to the same logical block, and hence it is possible to delay the timing at which a certain particular physical block in the same logical block becomes a bad block.

The wear leveling operation control unit 24 utilizes the fact that by the disassembly of a logical block and reassembly of a new logical block, each logical block is assembled from a set of physical blocks having degrees of wear similar to each other (erasing time lengths similar to each other or programming time lengths similar to each other, and the like) to thereby execute wear leveling for leveling erasing time lengths of a plurality of logical blocks or programming time lengths of a plurality of logical blocks. Here, leveling erasing time lengths of a plurality of logical blocks means reducing an erasing time length difference between the logical block having a maximum erasing time length and logical block having a minimum erasing time length. Further, leveling programming time lengths of a plurality of logical blocks means reducing a programming time length difference between the logical block having a maximum average programming time length and logical block having a minimum average programming time length.

In a normal wear leveling operation, an operation for reducing an erase count difference between the logical block having a maximum erase count and logical block having a minimum erase count is executed.

However, in the normal wear leveling operation using only the erase count, it is difficult to equalize the wear degrees of the logical blocks to the same degree. Because, even if plural logical blocks have the same erase count, the actual degrees of wear of physical blocks included in these logical blocks may be different from each other.

In this embodiment, wear leveling for leveling erasing time lengths or programming time lengths of a plurality of logical blocks is executed, and hence it is possible to equalize the wear degrees of the plurality of logical blocks to the same degree.

The DRAM interface 14 of FIG. 1 is a DRAM controller configured to access-control the DRAM 6. A storage area of the DRAM 6 is utilized to store therein a write buffer (WB) 31, look-up table (LUT) 32, and system management information 33. The system management information 33 includes various management information items necessary for the aforementioned logical block disassembly/reassembly.

Next, the configuration of the host 2 will be described below.

The host 2 is an information processing device configured to execute various programs. Programs to be executed by the information processing device include an application software layer 41, operating system (OS) 42, file system 43, and the like.

As generally known, the operating system (OS) 42 is the software configured to manage the whole host 2, control the hardware in the host 2, and execute control for enabling the applications to use the hardware and SSD 3.

The file system 43 is used to carry out control for file operation (creation, saving, update, deletion, and the like). For example, ZFS, Btrfs, XFS, ext4, NTFS, and the like may be used as the file system 43. Alternatively, a file object system (for example, Ceph Object Storage Daemon), and Key Value Store System (for example, Rocks DB) may be used as the file system 43.

Various application software threads run on the application software layer 41. Examples of the application software thread include client software, database software, virtual machine, and the like.

When it is necessary for the application software layer 41 to transmit a request such as a read command or write command to the SSD 3, the application software layer 41 transmits the request to the OS 42. The OS 42 transmits the request to the file system 43. The file system 43 translates the request into a command (read command, write command, and the like). The file system 43 transmits the command to the SSD 3. Upon receipt of a response from the SSD 3, the file system 43 transmits the response to the OS 42. The OS 42 transmits the response to the application software layer 41.

FIG. 6 illustrates a logical block management table 33A.

The logical block management table 33A is part of the system management information 33, and manages a plurality of physical block addresses corresponding to each logical block.

The logical block management table 33A includes a plurality of entries. Each of these entries may include a logical block ID field, and a plurality of (for example, 32) physical block ID fields. The logical block ID field holds a logical block ID. A logical block ID is an identifier capable of uniquely identifying each logical block. The logical block IDs may be, for example, consecutive numerals (logical block numbers) allocated to a plurality of logical blocks.

The plurality of (for example, 32) physical block ID fields hold a plurality of physical block IDs corresponding to a plurality of physical blocks included in a corresponding logical block. A physical block ID is an identifier capable of uniquely identifying each physical block. The physical block IDs may be expressed by, for example, a combination of a chip number and intra-chip block number. The chip number may be expressed by a combination of a channel number and bank number.

As described in connection with FIG. 2, in the case where the SSD 3 is constituted of 16 channels×2 banks, if each of the NAND flash memory chips has a single-plane configuration, each logical block is constituted of a total of 32 physical blocks each selected from 32 NAND flash memory chips one by one.

As an example, a case where the logical block #1 is constituted of, as illustrated at the lower part of FIG. 6, a physical block Blk2 in Chip1 belonging to a pair of a channel ch1 and bank bk0, physical block Blk3 in Chip2 belonging to a pair of a channel ch2 and bank bk0, physical block Blk7 in Chip3 belonging to a pair of a channel ch3 and bank bk0, . . . , physical block Blk4 in Chip17 belonging to a pair of the channel ch1 and a bank bk1, physical block Blk1 in Chip18 belonging to a pair of the channel ch2 and bank bk1, physical block Blk6 in Chip19 belonging to a pair of the channel ch3 and bank bk1, . . . is assumed. In this case, in an entry corresponding to the logical block #1 of the logical block management table 33A, (Chip1, Blk2), (Chip2, Blk3), (Chip3, Blk7), . . . , (Chip17, Blk4), (Chip18, Blk1), (Chip19, Blk6), . . . are registered.

The physical block ID (Chip1, Blk2) indicate the physical block Blk2 in Chip1 belonging to the pair of the channel ch1 and bank bk0. The physical block ID (Chip2, Blk3) indicate the physical block Blk3 in Chip2 belonging to the pair of the channel ch2 and bank bk0. The physical block ID (Chip3, Blk7) indicate the physical block Blk7 in Chip3 belonging to the pair of the channel ch3 and bank bk0. The physical block ID (Chip17, Blk4) indicate the physical block Blk4 in Chip17 belonging to the pair of the channel ch1 and bank bk1. The physical block ID (Chip18, Blk1) indicate the physical block Blk1 in Chip18 belonging to the pair of the channel ch2 and bank bk1. The physical block ID (Chip19, Blk6) indicate the physical block Blk6 in Chip19 belonging to the pair of the channel ch3 and bank bk1.

FIG. 7 illustrates a physical block erasing time table 33B.

The physical block erasing time table 33B is part of the system management information 33, and manages the erasing time length (tBERASE) of each of the physical blocks included in each of the aforementioned plurality of logical blocks. The erasing time length (tBERASE) of each physical block is obtained by the erasing time monitor 21 monitoring the erase operation sequence of each physical block.

As an example, in FIG. 7, that the erasing time length of the physical block having the physical block ID (Chip1, Blk1) is 2.5 msec, erasing time length of the physical block having the physical block ID (Chip1, Blk2) is 2.7 msec, erasing time length of the physical block having the physical block ID (Chip1, Blk3) is 2.6 msec, and erasing time length of the physical block having the physical block ID (Chip1, Blk4) is 5.0 msec is shown.

FIG. 8 illustrates a logical block erasing time table 33C.

The logical block erasing time table 33C is part of the system management information 33, and manages the erasing time length (tBERASE) corresponding to each of the aforementioned plurality of logical blocks. In this embodiment, the erasing time lengths (tBERASEs) of the physical blocks included in one logical block can basically be equalized to the same degree. Accordingly, as the erasing time length (tBERASE) corresponding to each logical block, an arbitrary value capable of expressing the same degree of erasing time length (tBERASE) can be used. For example, the erasing time length (tBERASE) corresponding to each logical block may be an average erasing time length or maximum erasing time length. An average erasing time length corresponding to a certain logical block indicates an average value of erasing time lengths of all the physical blocks included in the logical block. A maximum erasing time length corresponding to a certain logical block indicates the longest erasing time length among the erasing time lengths of the physical blocks included in the logical block. It should be noted that tBERASE can take various values depending on the erase operation of the NAND flash memory 5. More specifically, tBERASE is dependent on the values of the erasing voltage (VERA), erase step-up voltage (DVERA), erasing pulse application time (STC), and the like.

FIG. 9 illustrates a physical block erase count table 33D.

The physical block erase count table 33D is part of the system management information 33, and manages an erase count (for example, the number of program/erase cycles) of each of the physical blocks included in each of the aforementioned plurality of logical blocks.

As an example, in FIG. 9, that the number of program/erase cycles of a physical block having a physical block ID (Chip1, Blk1) is 100, number of program/erase cycles of a physical block having a physical block ID (Chip1, Blk2) is 105, number of program/erase cycles of a physical block having a physical block ID (Chip1, Blk3) is 103, number of program/erase cycles of a physical block having a physical block ID (Chip1, Blk4) is 99 is shown.

FIG. 10 illustrates a logical block erase count table 33E.

The logical block erase count table 33E is part of the system management information 33, and manages an erase count (for example, the average number of program/erase cycles or maximum number of program/erase cycles) of each of the aforementioned plurality of logical blocks. In this embodiment, erase counts of physical blocks included in a certain logical block are identical to each other as long as disassembly of this logical block is not carried out. On the other hand, when a new logical block is reassembled, there is a possibility of a set of physical blocks having different erase counts being included in the new logical block. Accordingly, as an erase count corresponding to each logical block, for example, an average erase count (average number of program/erase cycles) or maximum erase count (maximum number of program/erase cycles) may be used. An average erase count corresponding to a certain logical block indicates an average value of erase counts of all the physical blocks included in the logical block. A maximum erase count corresponding to a certain logical block indicates the largest erase count among the erase counts of the physical blocks included in the logical block.

FIG. 11 illustrates relationships between an active block pool 51, free block pool 52, and disassembled block pool 53 which are managed by the controller 4.

State of each of the logical blocks is roughly classified into an active block in which valid data is stored, and a free block in which no valid data is stored. Each logical block which is an active block is managed by a list called the active block pool 51. On the other hand, each logical block which is a free block is managed by a list called the free block pool 52.

The disassembled block pool 53 is a list configured to manage physical blocks which are de-allocated from each of the disassembled logical blocks.

In this embodiment, the controller 4 allocates one logical block (free block) selected from the free block pool 52 as a write-destination logical block to which write data received from the host 2 should be written. In this case, the controller first executes an erase operation for each physical block in the selected logical block (free block) to thereby bring each physical block in the logical block to an erased state to which data can be written. When the entire current write-destination logical block is filled with write data from the host 2, the controller 4 moves the current write-destination logical block to the active block pool 51, and allocates a new logical block (free block) from the free block pool 52 as a new write-destination logical block.

When all of valid data included in a certain logical block in the active block pool 51 are invalidated due to data update, unmapping, garbage collection, and the like, the controller 4 moves this logical block to the free block pool 52.

The controller 4 executes an erase operation with respect to a certain logical block in the free block pool 52 when needed. At this time, the erasing time monitor 21 of the controller 4 may monitor the erasing time length of each of physical blocks included in this logical block, and furthermore, the logical block disassembling/reassembling unit 23 of the controller 4 may determine whether or not physical blocks having different degrees of wear are mixed in the logical block on the basis of the monitored erasing time length of each of the physical blocks included in this logical block. More specifically, the logical block disassembling/reassembling unit 23 may determine whether or not a physical block having an erasing time length falling within a range specified by a certain set threshold value, and another physical block having erasing time length falling outside this range exist in this logical block. The physical block having erasing time length falling within a range specified by the threshold value may be determined as a physical block of a "small degree of wear" having relatively small degrees of wear, and the physical block having erasing time length falling outside this range may be determined as a physical block of a "large degree of wear" having relatively large degrees of wear. When it is determined that the physical block having an erasing time length falling within the range specified by the threshold value, and the physical block having erasing time length falling outside this range exist in this logical block, the logical block disassembling/reassembling unit 23 may reserve the logical block to be disassembled.

In the processing of disassembling the logical block reserved for disassembly to be disassembled, the logical block disassembling/reassembling unit 23 disassembles this logical block, and moves all the physical blocks included in the disassembled logical block to the disassembled block pool 53. That is, all the physical blocks included in the disassembled logical block are managed by the disassembled block pool 53. In the disassembled block pool 53, all the physical blocks may be managed for each pair of a channel and bank. Furthermore, all these physical blocks may be managed for each pair of a channel and bank, and for each degree of wear. For example, in the processing of disassembling the logical block #1, all the physical blocks which have constituted the logical block #1 are classified according to channels, banks, and degrees of wear, and are pooled in the disassembled block pool 53. Details of the disassembling processing algorithm will be described later with reference to FIG. 12 and FIG. 13.

In the processing of disassembling the logical block #1, the logical block disassembling/reassembling unit 23 may delete the contents (registered ID of the logical block #1, and IDs of the physical blocks which have constituted the logical block #1) of the entry corresponding to the logical block #1 in the logical block management table 33A of FIG. 6.

Thereafter, the logical block disassembling/reassembling unit 23 selects a set of physical blocks having erasing time lengths belonging to the same range, from physical blocks (disassembled physical blocks) in the disassembled block pool 53. In this case, the logical block disassembling/reassembling unit 23 selects, from the disassembled block pool 53, a plurality of physical blocks having erasing time lengths belonging to the same range (i.e., having degrees of wear similar to each other), and respectively belonging to different pairs of channels/banks. Then, the logical block disassembling/reassembling unit 23 reassembles a new logical block with the selected physical blocks. Details of the algorithm of this reassembling processing will be described later with reference to FIG. 14.

In the processing of reassembling a new logical block, the logical block disassembling/reassembling unit 23 may add an entry corresponding to the reassembled logical block to the logical block management table 33A of FIG. 6. In each physical block ID field corresponding to the logical block ID of this logical block, a physical block ID of each selected physical block is registered. For example, when the logical block #X is reassembled, an entry for the logical block #X is added to the logical block management table 33A, and the logical block ID #X, and a physical block ID of each of the physical blocks constituting the logical block #X are registered in this entry. Then, the logical block disassembling/reassembling unit 23 moves the reassembled new logical block (all the selected physical blocks) to the free block pool 52.

Next, with reference to FIG. 12, and FIG. 13, the processing of disassembling a logical block will be described below. Here, a case where each logical block is constituted of a total of four physical blocks obtained by selecting one by one from each of a total of four NAND flash memory chips of a 2 channels×2 banks configuration will be described.

Figure 12:
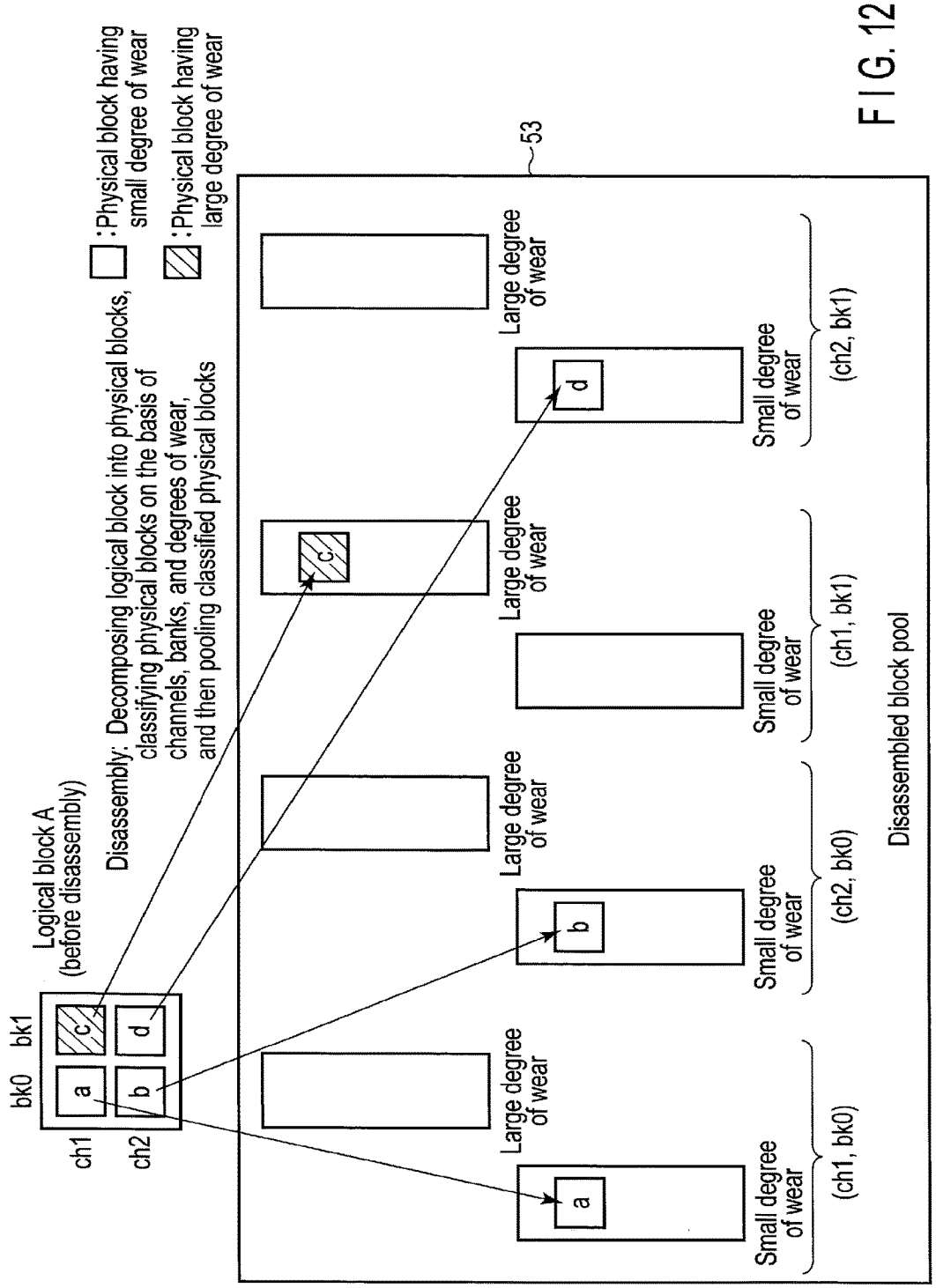
FIG. 12 is a view for explaining an algorithm for disassembly of a logical block which is executed by the memory system of the first embodiment.

In FIG. 12, a logical block A is constituted of a physical block "a", physical block "b", physical block "c", and physical block "d". The physical block "a" belongs to a pair of the channel ch1 and bank bk0. The physical block "b" belongs to a pair of the channel ch2 and bank bk0. The physical block "c" belongs to a pair of the channel ch1 and bank bk1. The physical block "d" belongs to a pair of the channel ch2 and bank bk1.

The disassembled block pool 53 may include eight pools, i.e., a pool (ch1, bk0, small degree of wear), pool (ch1, bk0, large degree of wear), pool (ch2, bk0, small degree of wear), pool (ch2, bk0, large degree of wear), pool (ch1, bk1, small degree of wear), pool (ch1, bk1, large degree of wear), pool (ch2, bk1, small degree of wear), and pool (ch2, bk1, large degree of wear).

The pool (ch1, bk0, small degree of wear) is a pool configured to manage physical blocks belonging to the pair of the channel ch1 and bank bk0, and having the "small degree of wear". The pool (ch1, bk0, large degree of wear) is a pool configured to manage physical blocks belonging to the pair of the channel ch1 and bank bk0, and having the "large degree of wear".

The pool (ch2, bk0, small degree of wear) is a pool configured to manage physical blocks belonging to the pair of the channel ch2 and bank bk0, and having the "small degree of wear". The pool (ch2, bk0, large degree of wear) is a pool configured to manage physical blocks belonging to the pair of the channel ch2 and bank bk0, and having the "large degree of wear".

The pool (ch1, bk1, small degree of wear) is a pool configured to manage physical blocks belonging to the pair of the channel ch1 and bank bk1, and having the "small degree of wear". The pool (ch1, bk1, large degree of wear) is a pool configured to manage physical blocks belonging to the pair of the channel ch1 and bank bk1, and having the "large degree of wear".

The pool (ch2, bk1, small degree of wear) is a pool configured to manage physical blocks belonging to the pair of the channel ch2 and bank bk1, and having the "small degree of wear". The pool (ch2, bk1, large degree of wear) is a pool configured to manage physical blocks belonging to the pair of the channel ch2 and bank bk1, and having the "large degree of wear". In the processing of disassembling the logical block A, the physical block "a", physical block "b", physical block "c", and physical block "d" are classified according to the channel, bank, and degree of wear, and are pooled in the disassembled block pool 53. For example, a case where it is determined that the physical block "c" is a physical block of the "large degree of wear", and physical blocks "a", "b", and "d" are physical blocks of the "small degree of wear" is assumed.

The physical block "a" is classified into the group of ch1, bk0, small degree of wear, and is placed in the pool (ch1, bk0, small degree of wear). The physical block "b" is classified into the group of ch2, bk0, small degree of wear, and is placed in the pool (ch2, bk0, small degree of wear). The physical block "c" is classified into the group of ch1, bk1, large degree of wear, and is placed in the pool (ch1, bk1, large degree of wear). The physical block "d" is classified into the group of ch2, bk1, small degree of wear, and is placed in the pool (ch2, bk1, small degree of wear).

Figure 13:
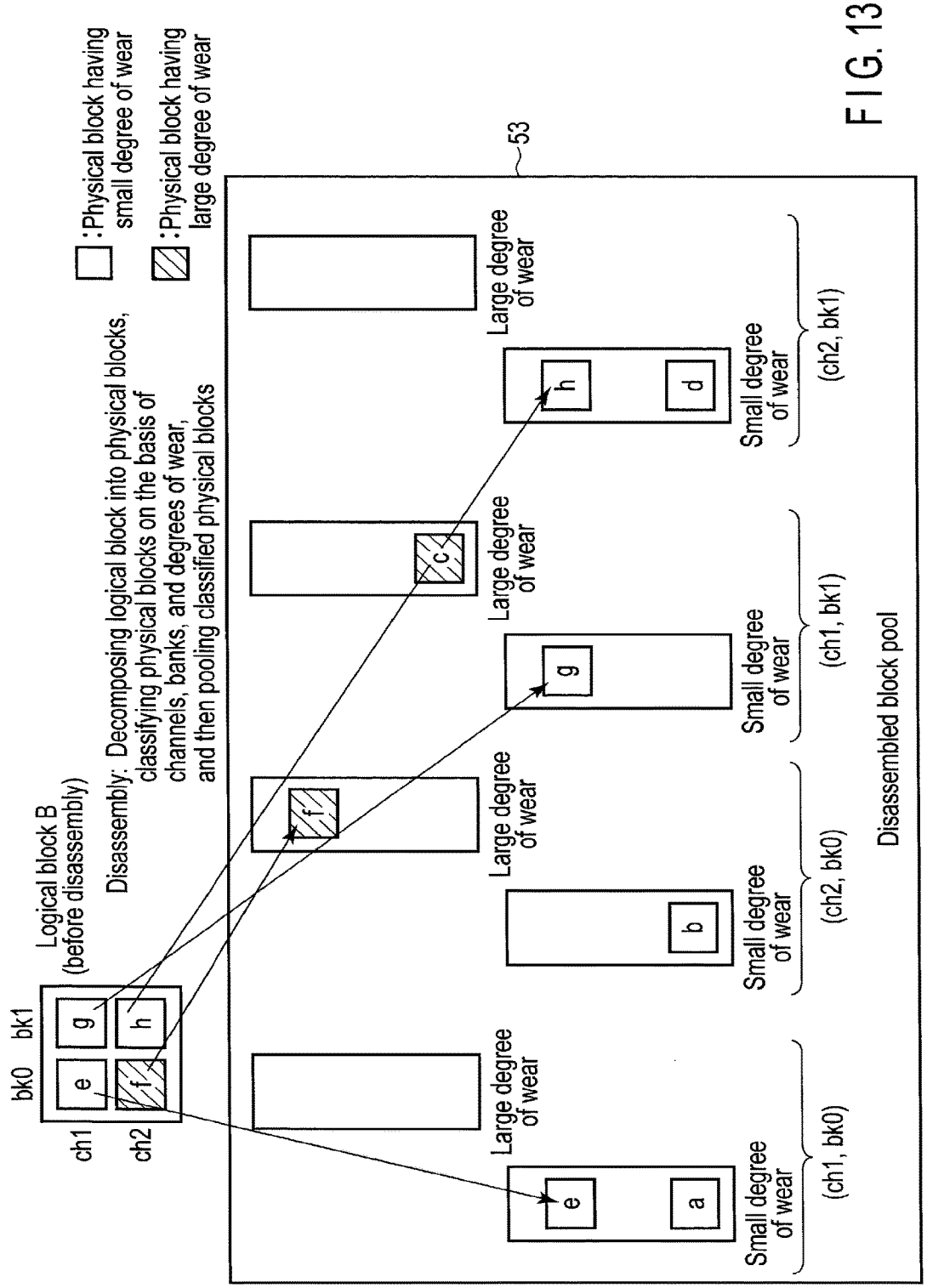
FIG. 13 is a view for explaining an algorithm for disassembly of a logical block which is executed by the memory system of the first embodiment.

FIG. 13 illustrates disassembling processing of another logical block (here, a logical block B).

The logical block B is constituted of a physical block "e", physical block "f", physical block "g", and physical block "h". The physical block "e" belongs to a pair of the channel ch1 and bank bk0. The physical block "f" belongs to a pair of the channel ch2 and bank bk0. The physical block "g" belongs to a pair of the channel ch1 and bank bk1. The physical block "h" belongs to a pair of the channel ch2 and bank bk1.

In the processing of disassembling the logical block B, the physical block "e", physical block "f", physical block "g", and physical block "h" are classified according to the channel, bank, and degree of wear, and are pooled in the disassembled block pool 53. For example, a case where it is determined that the physical block "f" is a physical block of the "large degree of wear", and physical blocks "e", "g", and "h" are physical blocks of the "small degree of wear" is assumed.

The physical block "e" is classified into the group of ch1, bk0, small degree of wear, and is placed in the pool (ch1, bk0, small degree of wear). The physical block "f" is classified into the group of ch2, bk0, large degree of wear, and is placed in the pool (ch2, bk0, large degree of wear). The physical block "g" is classified into the group of ch1, bk1, small degree of wear, and is placed in the pool (ch1, bk1, small degree of wear). The physical block "h" is classified into the group of ch2, bk1, small degree of wear, and is placed in the pool (ch2, bk1, small degree of wear).

FIG. 14 illustrates the processing of reassembling a new logical block.

Because of the disassembling of the logical block B described in connection with FIG. 13, physical blocks having degrees of wear similar to each other exist in all the pairs of channels/banks. In the examples of FIG. 13 and FIG. 14, in the pool (ch1, bk0, small degree of wear), pool (ch2, bk0, small degree of wear), pool (ch1, bk1, small degree of wear), and pool (ch2, bk1, small degree of wear), the physical blocks "a", "b", "g", and "d" respectively exist. Accordingly, the logical block disassembling/reassembling unit 23 selects physical blocks (here, the physical block "a", physical block "b", physical block "g", and physical block "d") one by one from the pools corresponding to the degrees of wear identical to each other, and reassembles a new logical block C with the selected physical blocks.

Figure 15:
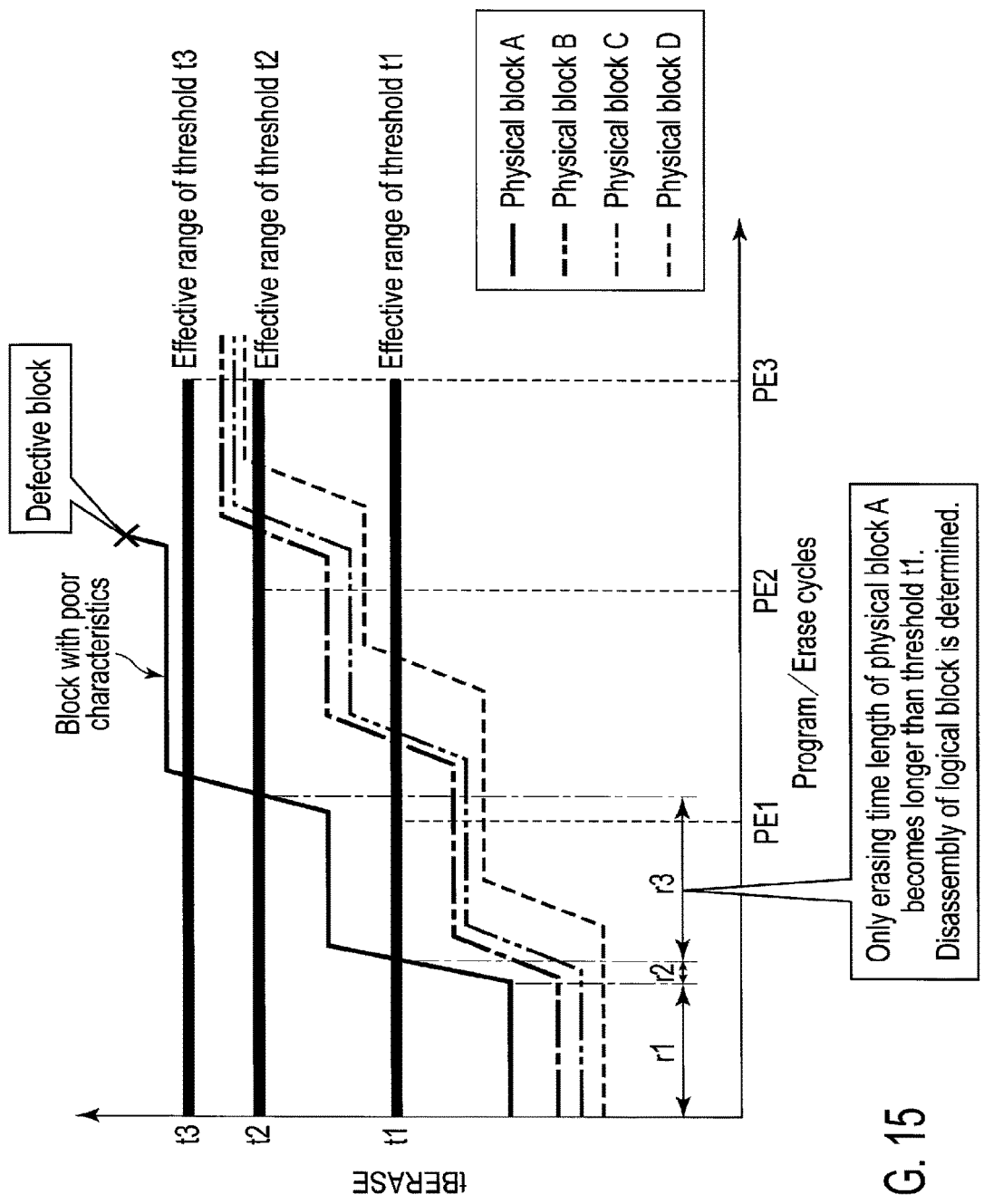
FIG. 15 is a view for explaining a relationship between an erase count and an erasing time length of each of the physical blocks included in the same logical block, and a logical block disassembling condition used in the first embodiment.

FIG. 15 illustrates an example of a relationship between an erase count (number of program/erase cycles) and erasing time length (tBERASE) of each of four physical blocks A, B, C, and D included in the same logical block, and a logical block disassembling condition used in this embodiment.

As described above, the erasing time length (tBERASE) of each of the physical blocks A, B, C, and D included in the same logical block becomes longer as the erase count (number of program/erase cycles) of each of the physical blocks A, B, C, and D increases. As long as this logical block is not disassembled, the erase counts of the physical blocks A, B, C, and D are equal.

Accordingly, when the characteristics of these physical blocks A, B, C, and D are totally identical to each other, the erasing time lengths (tBERASEs) of these physical blocks A, B, C, and D change in the same manner. That is, although the erasing time length of each of the physical blocks A, B, C, and D becomes longer as the erase count (number of program/erase cycles) of each of these physical blocks A, B, C, and D increases, differences between the erasing time lengths of these physical blocks A, B, C, and D ought to fall within a certain limited range at a point in time corresponding to any erase count.

However, actually there is sometimes a case where in the physical blocks A, B, C, and D, physical blocks having poor characteristics and those having excellent characteristics exist mixedly in the same logical block. Here, a physical block having excellent characteristics means a physical block having normal reliability to be desired. A physical block having poor characteristics means a physical block wearing earlier than the physical block having the normal reliability to be desired.

In FIG. 15, a case where the physical block A is a physical block having characteristics poorer than the other physical blocks B, C, and D each having normal reliability is assumed. In this case, as the erase count of this logical block increases, i.e., as the erase count of each of the physical blocks A, B, C, and D increases, the physical block A wears earlier than the other physical blocks B, C, and D. For this reason, a difference between the erase time length (tBERASE) of the physical block A and the erase time length (tBERASE) of a certain one of the other physical blocks becomes greater than a certain range at a point in time corresponding to a certain erase count.

In order to make it possible to detect a sign that the wear of only one or more specific physical blocks proceeds earlier as described above, the logical block disassembling/reassembling unit 23 determines whether or not this logical block satisfies the aforementioned logical block disassembling condition on the basis of the erasing time length (tBERASE) of each of the physical blocks included in this logical block.

As the logical block disassembling condition, a condition that the erasing time length of at least one of the physical blocks A, B, C, and D falls within a certain range (time range) specified by a threshold value, and the erasing time length of at least the other one physical block in the physical blocks A, B, C, and D falls outside this range (time range) can be used. The number of the threshold values may be one or may be plural.

In FIG. 15, in order to determine whether or not this disassembling condition is satisfied, three different threshold values t1, t2, and t3 are set. The threshold value t1 may be a threshold corresponding to an erase count reference value PE1. The threshold value t2 may be a threshold corresponding to an erase count reference value PE2. The threshold value t3 may be a threshold corresponding to an erase count reference value PE3. These threshold values are effective throughout the entire erase count range (entire P/E cycle number range). Further, a plurality of threshold values may be set. The logical block disassembling/reassembling unit 23 may first classify the erasing time lengths of the physical blocks A, B, C, and D included in the same logical block into the following four ranges (erasing time range).

0<erasing time length≤t1
t1<erasing time length≤t2
t2<erasing time length≤t3
t3<erasing time length The logical block disassembling/reassembling unit 23 may determine whether or not disassembly of the logical block is necessary on the basis of the classification result.

In the example of FIG. 15, when the erase count (number of program/erase cycles) of each of the physical blocks A, B, C, and D is within the erase count range r1, the erasing time lengths of all the physical blocks A, B, C, and D are similar to each other. The erase count of each of the physical blocks A, B, C, and D increases and reaches the erase count range r2. Then, in the erase count range r2, the erasing time length of the physical block A increases at a higher rate than the erasing time length of each of the other physical blocks B, C, and D. Then, the erase count of each of the physical blocks A, B, C, and D increases to reach the erase count range r3. In the erase count range r3, only the erasing time length of the physical block A is longer than the threshold value t1. That is, in the erase count range r3, a state (erase/program area) where while the erasing time length of each of the physical blocks B, C, and D is equal to or less than the threshold value t1, only the erasing time length of the physical block A becomes longer than the threshold value t1 appears. Accordingly, it is determined that the erasing time length of each of the physical blocks B, C, and D falls within the range (0<erasing time length t1) specified by the threshold value t1, and the erasing time length of the physical block A falls outside the range specified by the threshold value t1. In this case, the logical block disassembling/reassembling unit 23 determines that the reliability of the physical blocks constituting the logical block is deteriorated, i.e., that physical blocks having different degrees of wear mixedly exist in the logical block, and reserves the logical block to be disassembled.

As a result, it becomes possible to positively disassemble the logical block including the physical block A before the physical block A actually becomes a bad block (defective block). By the positive disassembly of the logical block and reassembly of the new logical block, it becomes possible to make the degrees of wear (here, erasing time lengths) of the physical blocks included in each logical block similar to each other.

It should be noticed that depending on the characteristics of the physical block A, until the erase count of this logical block reaches a larger erase count, there is sometimes a case where the erasing time length of the physical block A increases at a rate similar to the erasing time lengths of the other physical blocks B, C, and D.

The logical block disassembling condition in that case will be described below by using FIG. 16.

In FIG. 16, in the erase count range r1, the erasing time length of each of the physical blocks A, B, C, and D increases at an approximately identical rate. The erase count of each of the physical blocks A, B, C, and D increases and reaches the erase count range r2. Then, in the erase count range r2, the erasing time length of the physical block A increases at a higher rate than the erasing time lengths of the other physical blocks B, C, and D. Then, the erase count of each of the physical blocks A, B, C, and D increases to reach the erase count range r3. In the erase count range r3, only the erasing time length of the physical block A is longer than the threshold value t2. That is, in the erase count range r3, a state (erase/program area) where while the erasing time length of each of the physical blocks B, C, and D is equal to or less than the threshold value t2, only the erasing time length of the physical block A becomes longer than the threshold value t2 appears.

Accordingly, it is determined that the erasing time length of each of the physical blocks B, C, and D falls within the range (0<erasing time length≤t2) specified by the threshold value t2, and the erasing time length of the physical block A falls outside the range (0<erasing time length≤t2) specified by the threshold value t2. In this case, the logical block disassembling/reassembling unit 23 reserves the logical block to be disassembled.

As described above, in this embodiment, the threshold value greater than the threshold value t1, and threshold value t3 greater than the threshold value t2 are also set. Accordingly, for example, when it is determined that the erasing time length of each of the physical blocks B, C, and D included in the logical block having a certain program/erase cycles falls within the range specified by the threshold value t2 (or threshold value t3), and the erasing time length of the physical block A falls outside the range specified by the threshold value t2 (or threshold value t3), the logical block disassembling/reassembling unit 23 can determine that this logical block satisfies the disassembling condition, and can reserve this logical block to be disassembled.

It should be noted that in the examples of FIG. 15 and FIG. 16, although a case where the number of erasing time threshold values is three is exemplified, the number of threshold values is not limited to those of the examples.

Further, the erasing time length (tBERASE) of each of the physical blocks may be utilized not only in the determination whether or not the logical block is to be disassembled but also in the determination of a physical block to be treated as a bad block (defective block). In this case, for example, when an erase operation for each of physical blocks belonging to a certain logical block is executed, the controller 4 compares the erasing time length (tBERASE) required to carry out the erase operation for each of these physical blocks with the threshold value tBAD for bad block determination. If a physical block having erasing time length (tBERASE) longer than or equal to the threshold value tBAD exists, the controller 4 treats this physical block as a bad block (defective block). Thereby, it becomes possible, before a writing/reading/erase operation for a physical block (physical block having erasing time length (tBERASE) longer than or equal to tBAD) having a large degree of wear fails, to stop the use of this physical block.

The threshold value tBAD may be a value greater than the threshold value t3 described in connection with FIG. 15, and FIG. 16.

Figure 17:
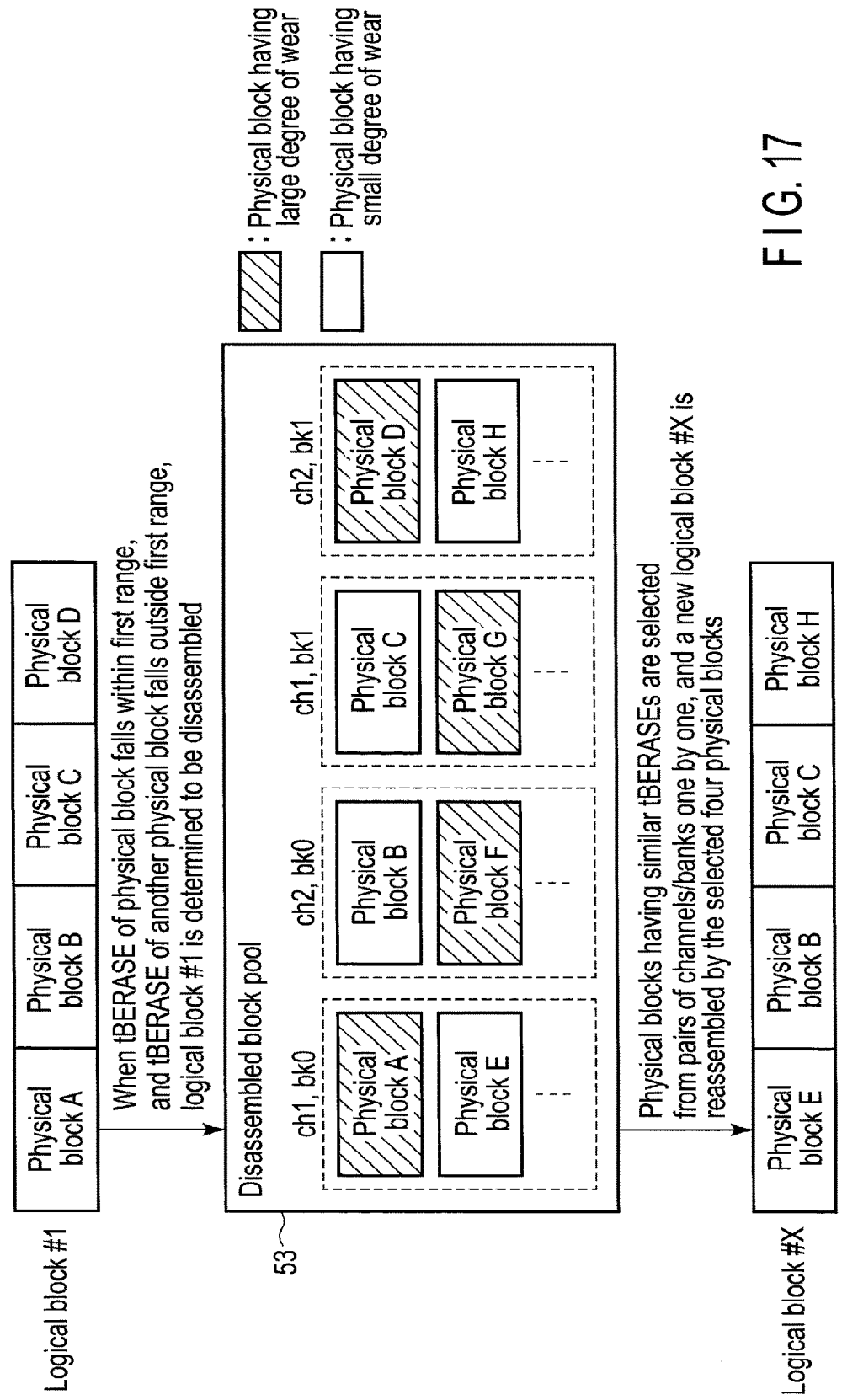
FIG. 17 is a view illustrating a logical block disassembling operation and a logical block reassembling operation, the operations being executed by the memory system of the first embodiment.

FIG. 17 illustrates a logical block disassembling operation and a logical block reassembling operation of this embodiment.

Here, a case where a logical block #1 is constituted of four physical blocks A, B, C, and D is assumed.

The logical block disassembling/reassembling unit 23 classifies the erasing time lengths of physical blocks included in the logical block #1 into the aforementioned plurality of erasing time ranges, and determines whether or not the erasing time length (tBERASE) of a certain physical block falls within an erasing time range (first range) specified by a certain threshold value, and erasing time length (tBERASE) of another physical block falls outside this range. As described in connection with FIG. 15, for example, when it is determined that the erasing time length of each of the physical blocks B, C, and D falls within an erasing time range specified by a certain threshold value, and erasing time length of the physical block A falls outside this erasing time range, the logical block disassembling/reassembling unit 23 determines that the logical block #1 is to be disassembled. In this case, the logical block disassembling/reassembling unit 23 reserves the logical block #1 to be disassembled. Further, at appropriate timing such as timing at which the logical block #1 becomes a free block, the logical block disassembling/reassembling unit 23 disassembles the logical block #1. In the disassembling processing, the logical block disassembling/reassembling unit 23 moves the physical block A, physical block B, physical block C, and physical block D which have constituted the logical block #1 to the disassembled block pool 53. In this case, as described in connection with FIG. 12 and FIG. 13, the physical block A, physical block B, physical block C, and physical block D are pooled in the disassembled block pool 53 according to the channels and banks. Further, in the disassembled block pool 53, degrees of wear of the physical blocks are classified, and these physical blocks are managed for each degree of wear.

It should be noted that when the physical block A, physical block B, physical block C, and physical block D are already in the erased state, this logical block #1 may not be disassembled immediately and, for example, this logical block #1 may first be allocated as a write destination logical block. Thereafter, when this logical block #1 is moved from the active block pool 51 to the free block pool 52, the logical block disassembling/reassembling unit 23 may disassemble the logical block #1.

Reassembly of a new logical block #X is carried out in the following manner.

As described in connection with FIG. 14, the logical block disassembling/reassembling unit 23 selects four physical blocks having erasing time lengths coincident with each other or similar to each other from physical blocks in the disassembled block pool 53. That is, the logical block disassembling/reassembling unit 23 selects physical blocks having erasing time lengths coincident with each other or similar to each other one by one from the four pairs of channels/banks. Then, the logical block disassembling/reassembling unit 23 reassembles the new logical block #X with the selected four physical blocks. The physical blocks having erasing time lengths (tBERASE) coincident with each other or similar to each other mean physical blocks having erasing time lengths falling within the same range (the same erasing time range).

In FIG. 17, a case where the logical block #X is reassembled with a physical block E belonging to a pair of ch1 and bk0, physical block B belonging to a pair of ch2 and bk0, physical block C belonging to a pair of ch1 and bk1, and physical block H belonging to a pair of ch2 and bk1 is exemplified.

It should be noticed that the logical block #X may be reassembled with four physical blocks having both erasing time lengths similar to each other, and erase counts similar to each other, i.e., four physical blocks having erasing time lengths belonging to the same erasing time range, and having erase counts belonging to the same erase count range. Thereby, it is possible to not only equalize the erasing time lengths of the physical blocks newly constituting the logical block #X but also equalize the erase counts of the physical blocks newly constituting the logical block #X.

When no four physical blocks satisfying the logical block reassembling condition exist in the disassembled block pool 53, the logical block disassembling/reassembling unit 23 may temporarily suspend reassembly of the logical block. Then, after another logical block is disassembled, whereby some new physical blocks are added to the disassembled block pool 53, the logical block disassembling/reassembling unit 23 may try to reassemble the new logical block.

Next, dynamic wear leveling and static wear leveling of this embodiment will be described below.

The wear leveling operation control unit 24 executes, on the basis of the erasing time length corresponding to each of all of logical blocks, wear leveling for leveling the erasing time lengths of these logical blocks.

First, with reference to FIG. 18, dynamic wear leveling executed by the wear leveling operation control unit 24 will be described below.

The wear leveling operation control unit 24 selects a logical block having the shortest erasing time length (minimum tBERASE) among logical blocks of the free block pool 52 (logical blocks including no valid data) on the basis of the erasing time length corresponding to each of the logical blocks. Then, the wear leveling operation control unit 24 executes an erase operation for each physical block in the selected logical block (free block) to thereby bring each physical block in the logical block to an erased state to which data can be written. Thereafter, the wear leveling operation control unit 24 preferentially allocates the selected logical block as a write destination logical block to which user data should be written. This write destination logical block can be utilized as a logical block to which write data from the host 2 is written (logical block for host writing), and can also be utilized as a logical block (movement destination logical block for GC) to which valid data moved from another logical block by garbage collection (GC) is written.

By virtue of the execution of the dynamic wear leveling, a logical block having short erasing time length becomes easier to be selected as a write destination logical block. Thereby, it is possible to preferentially use a logical block having short erasing time length for writing of user data (write data from the host 2, valid data to be moved from another logical block by GC). Accordingly, it becomes possible to reduce the erasing time length difference between a logical block having the maximum erasing time length and logical block having the minimum erasing time length, and equalize the degrees of wear of a plurality of logical blocks.

Figure 19:
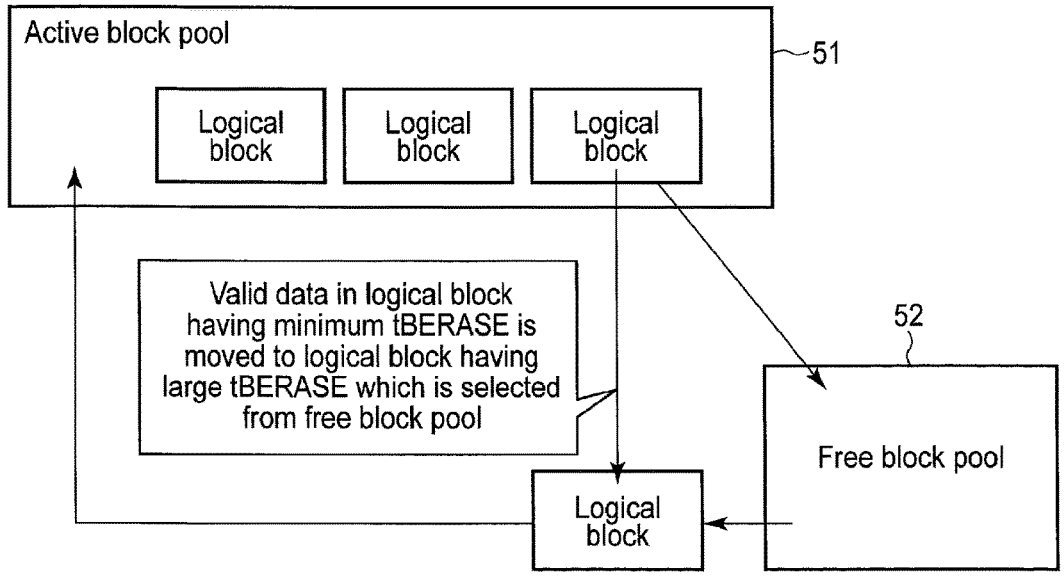
FIG. 19 is a view illustrating a static wear leveling operation which is executed by the memory system of the first embodiment.

Next, with reference to FIG. 19, static wear leveling executed by the wear leveling operation control unit 24 will be described below.

The wear leveling operation control unit 24 selects a logical block having the shortest erasing time length (minimum tBERASE) from the active block pool 51 (a set of logical blocks including valid data) on the basis of the erasing time length corresponding to each of the logical blocks. Then, the wear leveling operation control unit 24 moves the valid data stored in the selected logical block to a logical block which has erasing time length longer than the erasing time length of the selected logical block and is managed in the free block pool 52.

There is a strong possibility of the valid data stored in the logical block having the minimum tBERASE being cold data having a low frequency of update. Accordingly, by moving the cold data to another logical block having the long erasing time length, it becomes possible to utilize the logical block having the minimum tBERASE for writing of other data.

The logical block (logical block having the minimum tBERASE) having no longer valid data due to the movement of the valid data is moved from the active block pool 51 to the free block pool 52. The logical block to which the valid data stored in the logical block having the minimum tBERASE is written is moved to the active block pool 51. The erasing time length to be monitored is the erasing time length at the time when the block concerned has lastly undergone erasing, and the erasing time length is treated as the latest information in an operation log.

By virtue of the execution of the static wear leveling, a logical block having short erasing time length becomes easier to be moved to the free block pool 52, and hence the logical block having the short erasing time length becomes easier to be selected as a write destination logical block. Accordingly, it becomes possible to reduce the erasing time length difference between a logical block having the maximum erasing time length and logical block having the minimum erasing time length, and equalize the degrees of wear of a plurality of logical blocks.

Figure 20:
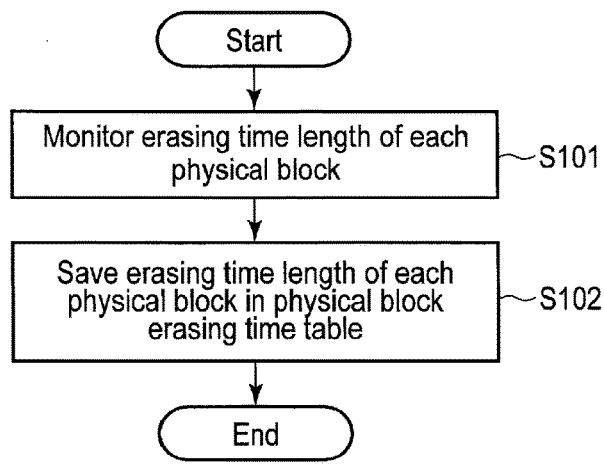
FIG. 20 is a flowchart illustrating a procedure for monitoring an erasing time length of each physical block, and saving a result of the monitoring, the procedure being executed by the memory system of the first embodiment.

The flowchart of FIG. 20 illustrates a procedure for monitoring the erasing time length of each physical block, and saving a result of the monitoring to be executed by the controller 4 (erasing time monitor 21).

The erasing time monitor 21 monitors the erasing time length of each physical block (step S101). In step S101, for example, when an erase operation of a certain logical block is executed, the erasing time monitor 21 may monitor the erasing time length of each of the physical blocks included in this logical block. Then, the erasing time monitor 21 saves the monitored erasing time length of each physical block in the physical block erasing time table 33B (step S102).

Figure 21:
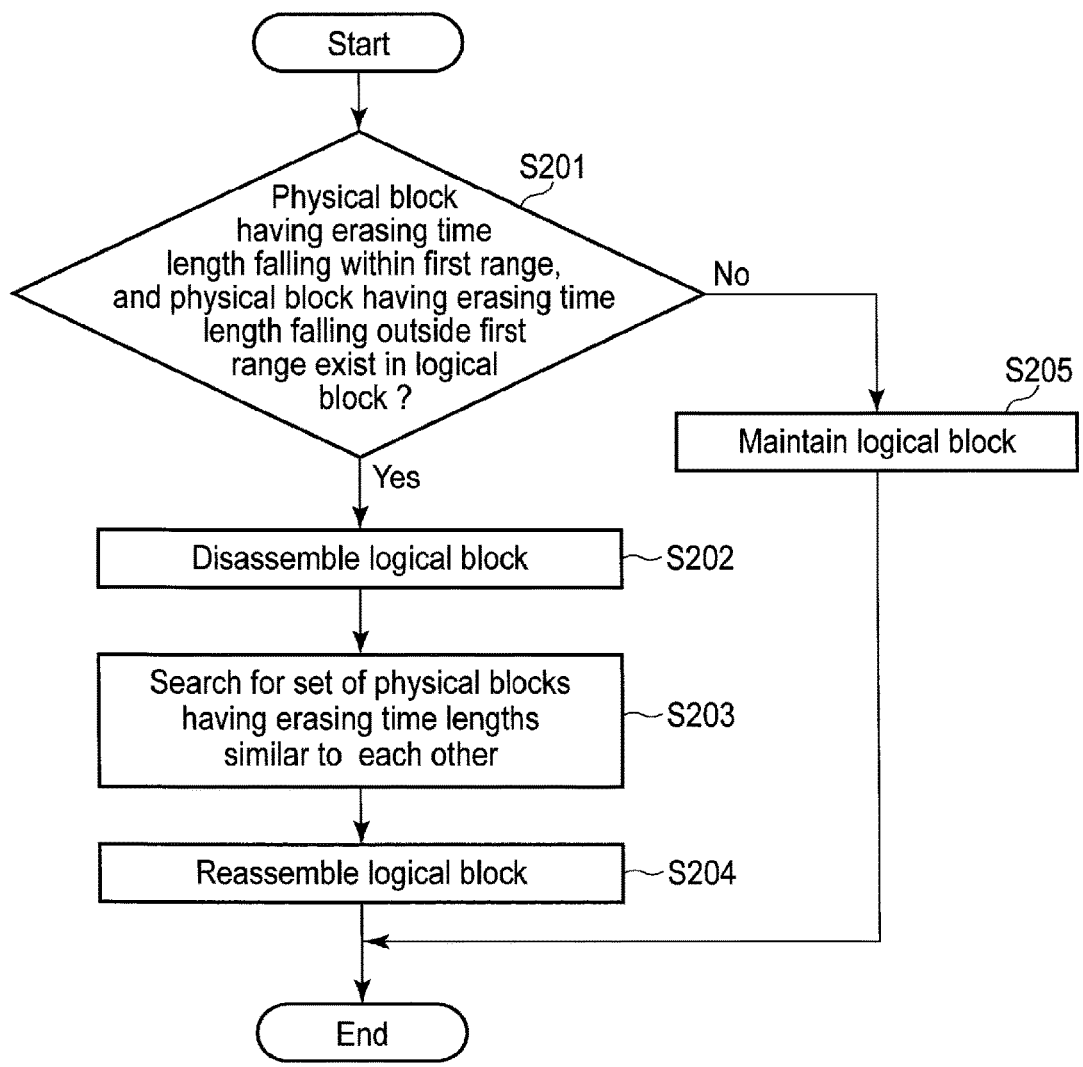
FIG. 21 is a flowchart illustrating a procedure for logical block disassembling and reassembling operations, the operations being executed by the memory system of the first embodiment.

The flowchart of FIG. 21 illustrates a procedure for an operation of disassembling a logical block and operation of reassembling a new logical block.

The logical block disassembling/reassembling unit 23 selects a logical block of an object to be processed, and determines whether or not a physical block having erasing time length falling within an erasing time range (first range) specified by a certain threshold value, and a physical block having erasing time length falling outside this erasing time range (first range) exist in the selected logical block (step S201).

When the erasing time lengths of all the physical blocks in the selected logical block fall within the erasing time range (first range) (NO of step S201), the logical block disassembling/reassembling unit 23 maintains the logical block (step S205).

On the other hand, when the physical block having erasing time length falling within the erasing time range (first range), and the physical block having erasing time length falling outside this erasing time range (first range) exist in the selected logical block (YES of step S201), the logical block disassembling/reassembling unit 23 reserves this logical block to be disassembled, and disassembles the logical block reserved for disassembly at appropriate timing (step S202).

In the processing of disassembling the logical block reserved for disassembly, the logical block disassembling/reassembling unit 23 disassembles this logical block, and moves all the physical blocks which have been included in the disassembled logical block to the disassembled block pool 53. All the physical blocks which have been included in the disassembled logical block are managed by the disassembled block pool 53. In the disassembled block pool 53, all the physical blocks may be managed for each pair of the channel and bank. Furthermore, these physical blocks may be managed for each pair of the channel and bank, and for each degree of wear.

After disassembling the logical block, the logical block disassembling/reassembling unit 23 searches the disassembled block pool 53 for a set of physical blocks having erasing time lengths similar to each other (step S203). In this case, the logical block disassembling/reassembling unit 23 selects a plurality of physical blocks having erasing time lengths belonging to the same range (i.e., having degrees of wear similar to each other), and respectively belonging to different pairs of channels/banks from the disassembled block pool 53. Upon discovery of a set of physical blocks appropriate for assembly of a logical block among physical blocks in the disassembled block pool 53, the logical block disassembling/reassembling unit 23 reassembles a new logical block with the set of the physical blocks (step S204).

It should be noted that physical blocks in the disassembled block pool 53 may be searched for a set of physical blocks having erasing time lengths similar to each other and erase counts similar to each other, and the new logical block may be reassembled with the set of the physical blocks having erasing time lengths similar to each other and erase counts similar to each other.

Second Embodiment

In the first embodiment, although whether or not the logical block disassembling condition is satisfied is determined on the basis of only the erasing time length of each of the physical blocks constituting the logical block, in a second embodiment, whether or not the logical block disassembling condition is satisfied is determined on the basis of a relationship between the erase count of each of physical blocks constituting one logical block and erasing time length of each of these physical blocks.

The hardware configuration of an SSD 3 according to the second embodiment is identical to the SSD 3 of the first embodiment, and the second embodiment differs from the first embodiment in only the procedure for the processing to be executed by the logical block disassembling/reassembling unit 23. Hereinafter, only the point different from the first embodiment will be described.

Figure 22:
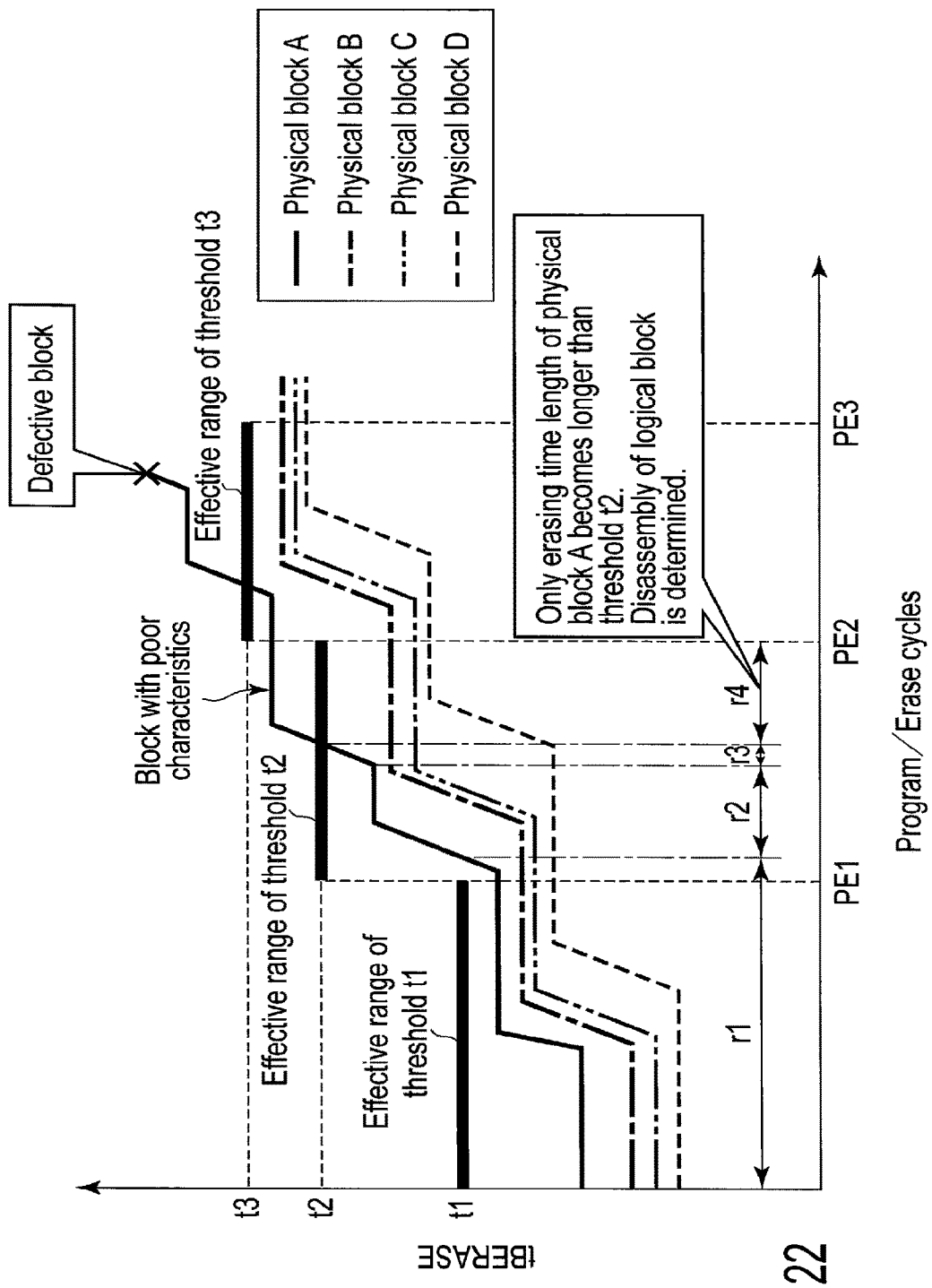
FIG. 22 is a view for explaining relationships between an erase count and an erasing time length of each of the physical blocks included in the same logical block, and a logical block disassembling condition used in a second embodiment.

FIG. 22 illustrates an example of a relationship between the erase count (number of program/erase cycles) and erasing time length (tBERASE) of each of four physical blocks A, B, C, and D included in the same logical block, and the logical block disassembling condition used in the second embodiment.

In the second embodiment, three threshold values t1, t2, and t3 respectively corresponding to three erase count reference values PE1, PE2, and PE3 are specified. Furthermore, an effective range of the threshold value t1 is limited to an erase count less than or equal to the erase count reference value PE1, effective range of the threshold value t2 is limited to an erase count greater than the erase count reference value PE1 and less than or equal to the erase count reference value PE2, and effective range of the threshold value t3 is limited to an erase count greater than the erase count reference value PE2 and less than or equal to the erase count reference value PE3.

The logical block disassembling/reassembling unit 23 determines, in consideration of the erase count of each of the physical blocks A, B, C, and D and erasing time length of each of the physical blocks A, B, C, and D, whether or not a physical block having erasing time length falling within a range (erasing time range) specified by a certain threshold value, and another physical block having erasing time length falling outside the range (erasing time range) exist in the same logical block.

More specifically, when the erase count of the logical block is less than or equal to PE1, i.e., when the erase count of each of the physical blocks A, B, C, and D is less than or equal to PE1, the logical block disassembling/reassembling unit 23 classifies the erasing time lengths of the physical blocks A, B, C, and D into an erasing time range less than or equal to the threshold value t1, and erasing time range greater than the threshold value t1. If the erasing time lengths of one or more physical blocks in the physical blocks A, B, C, and D are longer than the threshold value t1, and erasing time lengths of other one or more physical blocks are less than or equal to the threshold value t1, the logical block disassembling/reassembling unit 23 determines that this logical block should be disassembled.

When the erase count of the logical block is greater than PE1 and less than or equal to PE2, i.e., when the erase count of each of the physical blocks A, B, C, and D is greater than PE1 and less than or equal to PE2, the logical block disassembling/reassembling unit 23 classifies the erasing time lengths of the physical blocks A, B, C, and D into an erasing time range less than or equal to the threshold value t2, and erasing time range greater than the threshold value t2. If the erasing time lengths of one or more physical blocks in the physical blocks A, B, C, and D are longer than the threshold value t2, and erasing time lengths of other one or more physical blocks are less than or equal to the threshold value t2, the logical block disassembling/reassembling unit 23 determines that this logical block should be disassembled.

When the erase count of the logical block is greater than PE2 and less than or equal to PE3, i.e., when the erase count of each of the physical blocks A, B, C, and D is greater than PE2 and less than or equal to PE3, the logical block disassembling/reassembling unit 23 classifies the erasing time lengths of the physical blocks A, B, C, and D into an erasing time range less than or equal to the threshold value t3, and erasing time range greater than the threshold value t3. If the erasing time lengths of one or more physical blocks in the physical blocks A, B, C, and D are longer than the threshold value t3, and erasing time lengths of other one or more physical blocks are less than or equal to the threshold value t3, the logical block disassembling/reassembling unit 23 determines that this logical block should be disassembled.

In the example of FIG. 22, in the erase count range r1, the erasing time length of each of all the physical blocks A, B, C, and D falls within the range less than or equal to the threshold value t1 (0<erasing time length≤t1). Accordingly, the logical block disassembling condition is not satisfied.

The erase count of each of the physical blocks A, B, C, and D increases, and reaches the erase count range r2. Then, in the erase count range r2, a physical block having erasing time length exceeding the threshold value t1, and a physical block having erasing time length held less than or equal to the threshold value t1 mixedly exist in the physical blocks A, B, C, and D. However, the effective range of the threshold value t1 is limited to the erase count less than or equal to PE1, and hence in the erase count range r2, the threshold value t1 is not used for the determination whether or not the logical block disassembling condition is satisfied, and the threshold value t2 is used for the determination whether or not the disassembling condition is satisfied.

In the erase count range r2, the erasing time length of each of all the physical blocks A, B, C, and D falls within the range less than or equal to the threshold value t2. Accordingly, the logical block disassembling condition is not satisfied.

The erase count of each of the physical blocks A, B, C, and D increases, and reaches the erase count range r3. In the erase count range r3, the erasing time length of the physical block A increases at a higher rate than the erasing time lengths of the other physical blocks B, C, and D. Then, the erase count of each of the physical blocks A, B, C, and D increases, and reaches the erase count range r4. In the erase count range r4, only the erasing time length of the physical block A is longer than the threshold value t2. That is, in the erase count range r4, a state where while the erasing time length of each of the physical blocks B, C, and D is less than or equal to the threshold value t2, only the erasing time length of the physical block A becomes longer than the threshold value t2 appears. Accordingly, it is determined that the erasing time length of each of the physical blocks B, C, and D falls within the range specified by the threshold value t2 (0<erasing time length≤t2), and the erasing time length of the physical block A falls outside the range specified by the threshold value t2 (0<erasing time length≤t2). In this case, the logical block disassembling/reassembling unit 23 determines that physical blocks having different degrees of wear mixedly exist in the logical block, and reserves the logical block to be disassembled.

As a result, it becomes possible to disassemble the logical block including the physical block A before the physical block A actually becomes a bad block (defective block). By virtue of the disassembly of this logical block and reassembly of a new logical block, it becomes possible to equalize the degrees of wear (here, erasing time lengths) of all the physical blocks included in each logical block. Further, in the second embodiment, the effective range of each threshold value is limited to only a specific erase count range, and hence it is possible to prevent logical block disassembly from being excessively executed.

It should be noted that in the example of FIG. 22, although an example in which three threshold values corresponding to three erase count reference values are used is shown, the numbers of the erase count reference values and threshold values are not limited to the example, and one or more arbitrary numbers of erase count reference values and threshold values can be used.

FIG. 23 illustrates a logical block disassembling operation and a logical block reassembling operation of the second embodiment.

Here, a case where a logical block #1 is constituted of four physical blocks A, B, C, and D is assumed.

The logical block disassembling/reassembling unit 23 specifies an erase count reference value corresponding to an erase count of each of the physical blocks A, B, C, and D included in the logical block #1, and compares a threshold value associated with the specified erase count reference value and the erasing time length of each of the physical blocks A, B, C, and D with each other.

As described in connection with FIG. 22, when only the erasing time length of the physical block A among the physical blocks A, B, C, and D becomes longer than the threshold value associated with the specified erase count reference value, the logical block disassembling/reassembling unit 23 disassembles the logical block #1, and moves the physical block A, physical block B, physical block C, and physical block D which have constituted the logical block #1 to the disassembled block pool 53. Here, the physical block A, physical block B, physical block C, and physical block D are pooled in the disassembled block pool 53 according to the channels and banks. Further, in the disassembled block pool 53, degrees of wear of the physical blocks are classified, and the physical blocks are managed for each degree of wear.

It should be noted that when the physical block A, physical block B, physical block C, and physical block D are already in the erased state, this logical block #1 may not be disassembled immediately. In this case, this logical block #1 may first be allocated as a write destination logical block. Thereafter, when this logical block #1 is moved from the active block pool 51 to the free block pool 52, the logical block disassembling/reassembling unit 23 may disassemble the logical block #1.

Reassembly of a new logical block #X is carried out in the following manner.

The logical block disassembling/reassembling unit 23 selects four physical blocks having erasing time lengths (tBERASEs) coincident with each other or similar to each other from physical blocks in the disassembled block pool 53. That is, the logical block disassembling/reassembling unit 23 selects physical blocks having erasing time lengths coincident with each other or similar to each other one by one from the pairs of channels/banks. Then, the logical block disassembling/reassembling unit 23 reassembles the new logical block #X with the selected four physical blocks. The physical blocks having erasing time lengths (tBERASEs) coincident with each other or similar to each other mean physical blocks having erasing time lengths belonging to the same range (same erasing time range).

In FIG. 23, a case where the logical block #X is reassembled with a physical block E belonging to a pair of ch1 and bk0, physical block B belonging to a pair of ch2 and bk0, physical block C belonging to a pair of ch1 and bk1, and physical block H belonging to a pair of ch2 and bk1 is exemplified.

It should be noticed that, as in the case of the first embodiment, the logical block #X may be reassembled with four physical blocks having erasing time lengths belonging to the same range (same erasing time range), and having erase counts belonging to the same range (same erase count range). Further, when no four physical blocks satisfying the logical block reassembling condition exist in the disassembled block pool 53, the logical block disassembling/reassembling unit 23 may temporarily suspend reassembly of the logical block. Then, after another logical block is disassembled, whereby some new physical blocks are added to the disassembled block pool 53, the logical block disassembling/reassembling unit 23 may try to reassemble the new logical block.

Figure 24:
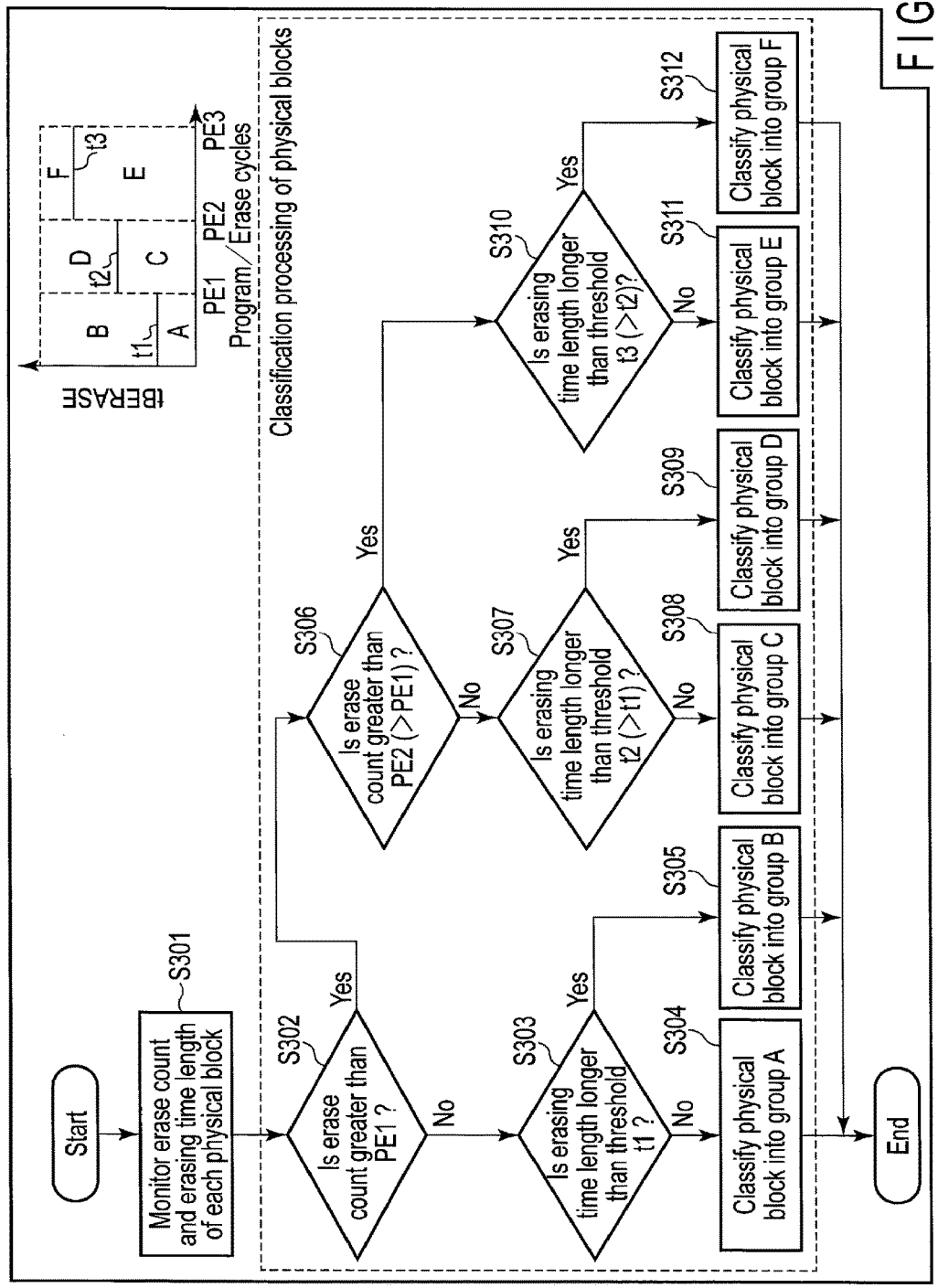
FIG. 24 is a flowchart illustrating a procedure for classifying physical blocks on the basis of the erasing time lengths and erase counts, the procedure being executed by the memory system of the second embodiment.

The flowchart of FIG. 24 illustrates a procedure for the processing of classifying physical blocks on the basis of the erasing time length and erase count, which is executed by the SSD 3 of the second embodiment.

The controller 4 monitors the erase count and erasing time length of each physical block (step S301).

Next, the controller 4 carries out classification processing of physical blocks according to the erase count and erasing time length of each physical block (steps S302 to S312). In the classification processing, as shown at the upper right of FIG. 24, physical blocks may be classified into a group A, group B, group C, group D, group E, and group F. The group A is a group of physical blocks each of which has an erase count less than or equal to PE1, and erasing time length less than or equal to the threshold value t1. The group B is a group of physical blocks each of which has an erase count less than or equal to PE1, and erasing time length longer than the threshold value t1. The group C is a group of physical blocks each of which has an erase count greater than PE1 and less than or equal to PE2, and erasing time length less than or equal to the threshold value t2. The group D is a group of physical blocks each of which has an erase count greater than PE1 and less than or equal to PE2, and erasing time length longer than the threshold value t2. The group E is a group of physical blocks each of which has an erase count greater than PE2 and less than or equal to PE3, and erasing time length less than or equal to the threshold value t3. The group F is a group of physical blocks each of which has an erase count greater than PE2 and less than or equal to PE3, and erasing time length longer than the threshold value t3.

Hereinafter, details of physical block classification processing will be described.

The controller 4 selects one physical block of an object to be processed, and when the erase count of the selected physical block is less than or equal to PE1 (No of step S302), determines whether or not the erasing time length of the selected physical block is longer than the threshold value t1 (step S303).

When the erasing time length of the selected physical block is less than or equal to the threshold value t1 (NO of step S303), the controller 4 classifies the selected physical block into the group A (step S304).

When the erasing time length of the selected physical block is longer than the threshold value t1 (YES of step S303), the controller 4 classifies the selected physical block into the group B (step S305).

When the erase count of the selected physical block exceeds PE1 and less than or equal to PE2 (YES of step S302, NO of step S306), the controller 4 determines whether or not the erasing time length of the selected physical block is longer than the threshold value t2 (step S307). When the erasing time length of the selected physical block is less than or equal to the threshold value t2 (NO of step S307), the controller 4 classifies the selected physical block into the group C (step S308).

When the erasing time length of the selected physical block is longer than the threshold value t2 (YES of step S307), the controller 4 classifies the selected physical block into the group D (step S309).

When the erase count of the selected physical block exceeds PE2 and less than or equal to PE3 (YES of step S302, YES of S306), the controller 4 determines whether or not the erasing time length of the selected physical block is longer than the threshold value t3 (step S310).

When the erasing time length of the selected physical block is less than or equal to the threshold value t3 (NO of step S310), the controller 4 classifies the selected physical block into the group E (step S311).

When the erasing time length of the selected physical block is longer than the threshold value t3 (YES of step S310), the controller 4 classifies the selected physical block into the group F (step S312).

It should be noted that when the erasing time length of the selected physical block is greater than or equal to the aforementioned threshold value tBAD, the controller 4 may determine that this physical block is to be treated as a bad block. In this case, the controller may classify each of physical blocks having erasing time lengths greater than or equal to the threshold value tBAD into the group X for bad blocks. The physical block classified as the group X (bad block) is not used for reassembly of a new logical block. That is, the controller 4 uses only a group of physical blocks classified into the groups A to F for reassembly of a logical block.

The flowchart of FIG. 25 illustrates a procedure for a logical block disassembling operation to be executed by the SSD 3 of the second embodiment.

The logical block disassembling/reassembling unit 23 refers to the physical block classification result obtained by the processing of FIG. 24 (step S401) to determine whether or not disassembly of a logical block is necessary for each logical block (step S402). In step S402, the logical block disassembling/reassembling unit 23 first selects one logical block of an object to be processed, and determines whether or not disassembly of the selected logical block is necessary on the basis of the classification result of the physical blocks included in the selected logical block.

In this case, when the selected logical group is one of, for example, (1) a logical block in which a physical block belonging to the group A and a physical block belonging to the group B are mixed, (2) a logical block in which a physical block belonging to the group C and a physical block belonging to the group D are mixed, and (3) a logical block in which a physical block belonging to the group E and a physical block belonging to the group F are mixed, the logical block disassembling/reassembling unit 23 may determine that disassembly of the selected logical block is necessary.

Further, when a physical block belonging to one of the group A, group C, and group E, and a physical block belonging to one of the group B, group D, and group F exist in the physical blocks constituting the selected logical block too, the logical block disassembling/reassembling unit 23 may determine that disassembly of the logical block is necessary.

When it is determined that disassembly of the logical block is necessary (YES of step S403), the logical block disassembling/reassembling unit 23 reserves the selected logical block to be disassembled, and disassembles the logical block at appropriate timing (step S404). When it is determined that disassembly of the logical block is unnecessary (NO of step S403), the logical block disassembling/ reassembling unit 23 does not disassemble the selected logical block to maintain it (step S405).

In the processing of disassembling the logical block reserved to be disassembled, the logical block disassembling/reassembling unit 23 disassembles the logical block, and moves all the physical blocks which have been included in the disassembled logical block to the disassembled block pool 53. The physical blocks which have been included in the disassembled logical block are each managed by the disassembled block pool 53. In the disassembled block pool 53, the physical blocks may be respectively managed according to pairs of a channel and bank, and degrees of wear as described in connection with FIG. 12 and FIG. 13.

Further, in the processing of reassembling a new logical block, the logical block disassembling/reassembling unit 23 selects, from the disassembled block pool 53, a plurality of physical blocks having erasing time lengths belonging to the same range (i.e., having degrees of wear similar to each other), and respectively belonging to different pairs of a channel and bank. The logical block disassembling/reassembling unit 23 reassembles a new logical block with a set of the selected physical blocks.

It should be noted that in step S402 described above, it may be determined that a logical block including a physical block classified into the group X (physical block having erasing time length longer than or equal to tBAD) also needs to be disassembled. In this case, the logical block disassembling/reassembling unit 23 disassembles the logical block including the physical block classified into the group X (bad block), moves the bad block which has been included in the logical block to the bad block pool for managing bad blocks, and moves all of the other physical blocks which have been included in the disassembled logical block to the disassembled block pool 53. Physical blocks in the bad block pool are not used for reassembly of a logical block.

Third Embodiment

In the first and second embodiment, the erasing time length (or both the erasing time length and erase count) of each physical block is monitored, whereby disassembly and reassembly of the logical block are executed. In a third embodiment, the programming time length (or both the programming time length and erase count) of the physical block is monitored, whereby disassembly and reassembly of the logical block are executed.

The hardware configuration of an SSD according to the third embodiment is identical to the SSD 3 of the first embodiment, and the third embodiment differs from the first embodiment in only the procedure for the processing to be executed by the logical block disassembling/reassembling unit 23. Hereinafter, only the point different from the first embodiment will be described.

Figure 26:
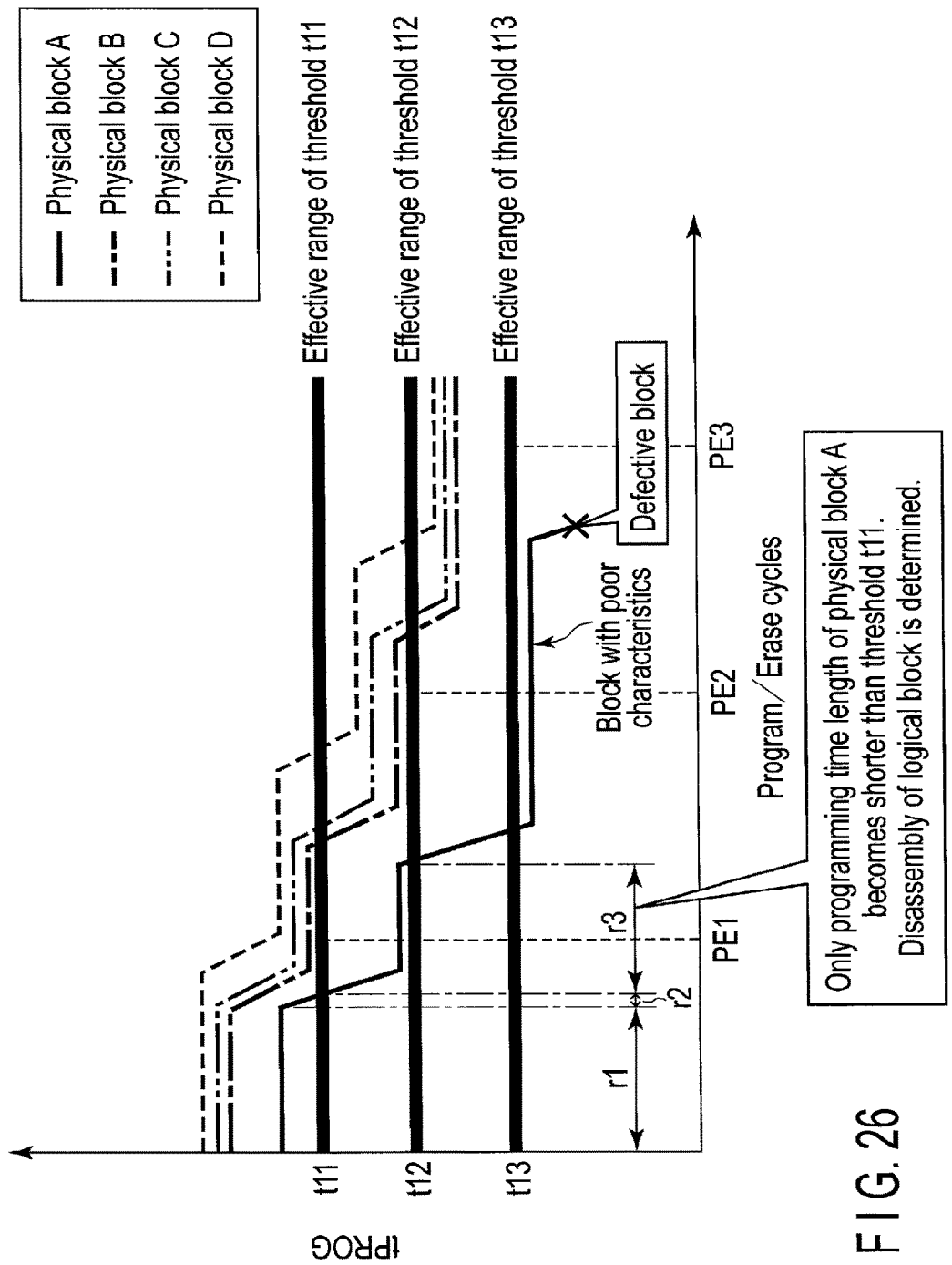
FIG. 26 is a view for explaining relationships between an erase count and programming time length of each of the physical blocks included in the same logical block, and a logical block disassembling condition used in a third embodiment.

FIG. 26 illustrates an example of a relationship between an erase count (number of program/erase cycles) and programming time length (tPROG) of each of four physical blocks A, B, C, and D included in the same logical block, and a logical block disassembling condition used in the third embodiment.

As described above, the programming time length of each of the physical blocks A, B, C, and D included in the same logical block becomes shorter as the erase count (number of program/erase cycles) of each of these physical blocks A, B, C, and D increases. As long as the logical block is not disassembled, the erase counts of the physical blocks A, B, C, and D are identical to each other.

Accordingly, when the characteristics of these physical blocks A, B, C, and D are totally identical to each other, the programming time length of each of these physical blocks A, B, C, and D changes in the same manner. That is, although the programming time length of each of the physical blocks A, B, C, and D becomes shorter as the erase counts (numbers of program/erase cycles) of these physical blocks A, B, C, and D increase, differences between the programming time lengths of these physical blocks A, B, C, and D ought to fall within a certain limited range at a point in time corresponding to any erase count.

However, actually there is sometimes a case where in the physical blocks A, B, C, and D, physical blocks having poor characteristics and those having excellent characteristics exist mixedly in the same logical block.

In FIG. 26, a case where the physical block A is a physical block having characteristics poorer than the other physical blocks B, C, and D each having normal reliability is assumed. In this case, as the erase count (number of program/erase cycles) of each of the physical blocks A, B, C, and D increases, the programming time length (tPROG) of the physical block A decreases at a higher rate than the other physical blocks B, C, and D. For this reason, the difference between the programming time length of the physical block A and the programming time lengths of some other physical block becomes greater than a certain range at a point in time corresponding to a certain erase count.

In order to detect a sign that the wear of only one or more specific physical blocks proceeds earlier as described above, the logical block disassembling/reassembling unit 23 determines whether or not this logical block satisfies the logical block disassembling condition on the basis of the programming time length (tPROG) of each of the physical blocks included in the same logical block.

As the logical block disassembling condition, a condition that the programming time length of at least one of the physical blocks A, B, C, and D falls within a certain range (time range), and the programming time length of at least another physical block in the physical blocks A, B, C, and D falls outside the time range can be used.

In the example of FIG. 26, when the erase count (number of program/erase cycles) of each of the physical blocks A, B, C, and D is within the erase count range r1, the programming time lengths of the physical blocks A, B, C, and D are similar to each other. The erase count of each of the physical blocks A, B, C, and D increases and reaches the erase count range r2. In the erase count range r2, the programming time length of the physical block A decreases at a higher rate than the other physical blocks B, C, and D. Then, the erase count of each of the physical blocks A, B, C, and D increases to reach the erase count range r3. In the erase count range r3, only the programming time length of the physical block A is shorter than the threshold value t11. That is, in the erase count range r3, a state where while the programming time length of each of the physical blocks B, C, and D is longer than or equal to the threshold value t11, only the programming time length of the physical block A becomes shorter than the threshold value t11 appears.

Accordingly, it is determined that the programming time length of each of the physical blocks B, C, and D falls within the range (programming time range having a lower limit of t11) specified by the threshold value t11, and the programming time length of the physical block A falls outside the range specified by the threshold value t11. In this case, the logical block disassembling/reassembling unit 23 reserves the logical block to be disassembled.

As a result, it becomes possible to positively disassemble the logical block including the physical block A and to positively reassemble the new logical block, before the physical block A actually becomes a bad block (defective block). By the positive disassembly of the logical block and reassembly of the new logical block, it becomes possible to make the degrees of wear (here, programming time lengths) of the physical blocks included in each logical block similar to each other.

FIG. 27 illustrates a physical block programming time table 33F used in the third embodiment.

The physical block programming time table 33F is part of the system management information 33, and manages the programming time length (tPROG) of each of all the physical blocks of the NAND flash memory chips #1 to #32. The programming time length of each of the physical blocks is used when determining whether or not a logical block is to be disassembled or when reassembly of a logical block is carried out. Here, tPROG may be an average writing time of all the pages in each physical block or in a logical block, or may be an average writing time of a plurality of pages. Here, the pages to be used for calculating an average value of the programming time length may be a plurality of consecutive pages or a plurality of discontinuous pages.

It is shown in FIG. 27 as an example that the programming time length of a physical block having a physical block ID (Chip1, Blk1) is 300 µsec, programming time length of a physical block having a physical block ID (Chip1, Blk2) is 320 µsec, programming time length of a physical block having a physical block ID (Chip1, Blk3) is 310 µsec, and programming time length of a physical block having a physical block ID (Chip1, Blk4) is 600 µsec.

FIG. 28 illustrates a logical block programming time table 33G used in the third embodiment.

The logical block programming time table 33G is part of the system management information 33, and manages the programming time length (tPROG) corresponding to each of the plurality of logical blocks described above. In the third embodiment, the programming time lengths (tPROGs) of the physical blocks included in one logical block are basically equalized to the same degree. Accordingly, as the programming time length (tPROG) corresponding to each logical block, any value capable of expressing the programming time length of the same degree can be used. For example, the programming time length (tPROG) corresponding to each logical block may be the average programming time length or may be the minimum programming time length. The average programming time length corresponding to a certain logical block indicates an average value of the programming time lengths of the physical blocks included in the logical block. The minimum programming time length corresponding to a certain logical block indicates the shortest programming time length among the physical blocks included in the logical block.

Figure 29:
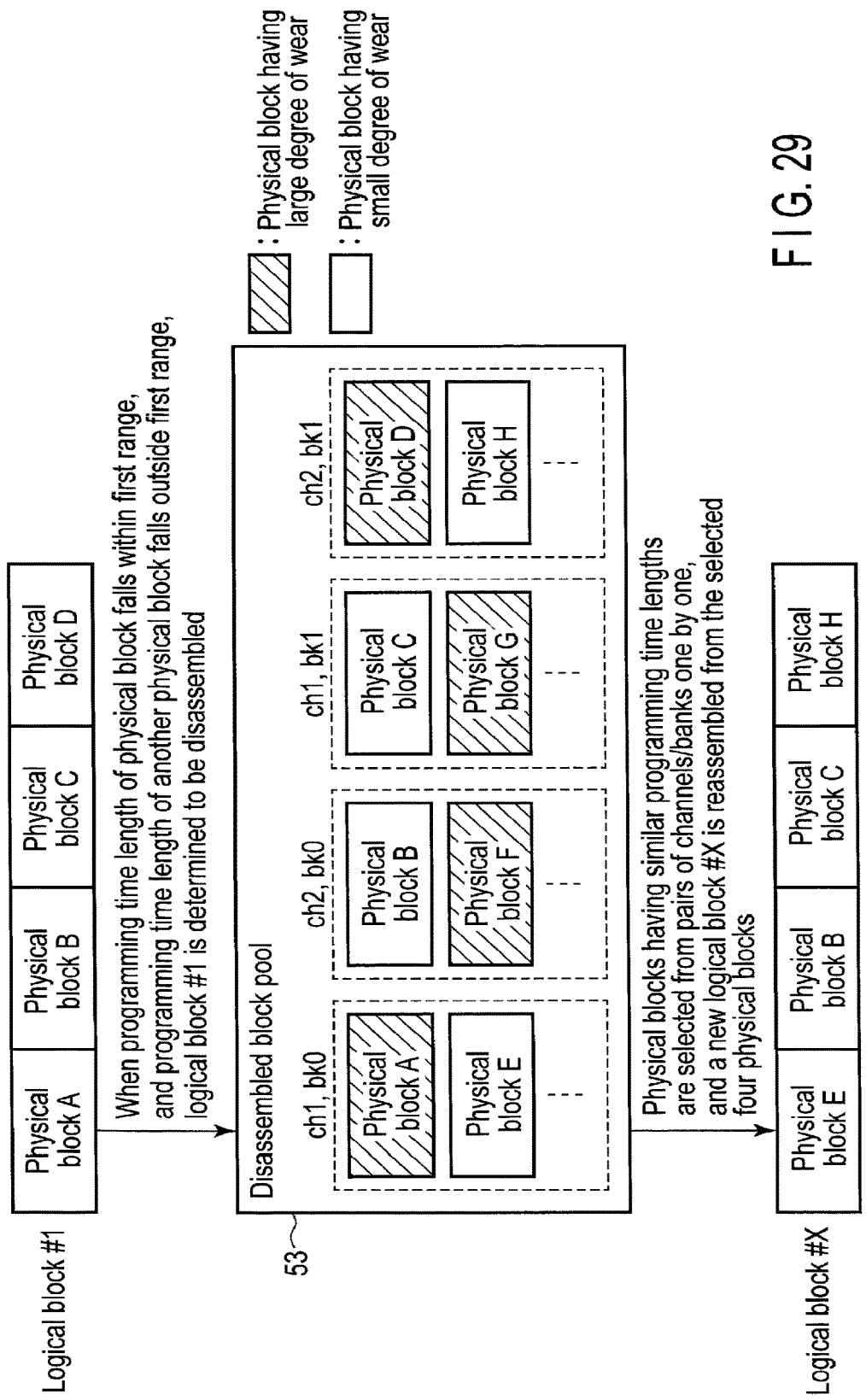
FIG. 29 is a view illustrating a logical block disassembling operation and a logical block reassembling operation, the operations being executed by the memory system of the third embodiment.

FIG. 29 illustrates a logical block disassembling operation and a logical block reassembling operation of the third embodiment.

Here, a case where a logical block #1 is constituted of four physical blocks A, B, C, and D is assumed.

The logical block disassembling/reassembling unit 23 classifies the programming time lengths of the physical blocks included in the logical block #1 into a plurality of programming time ranges to thereby determine whether or not the programming time length (tPROG) of a certain physical block falls within a certain programming time range (first range), and the programming time length (tPROG) of another physical block falls outside the programming time range (first range). As described in connection with FIG. 26, for example, when it is determined that the programming time length of each of the physical blocks B, C, and D falls within the programming time range specified by the threshold value t11, and the programming time length of the physical block A falls outside the programming time range specified by the threshold value t11, the logical block disassembling/reassembling unit 23 reserves the logical block #1 to be disassembled. Then, at appropriate timing such as timing at which the logical block #1 becomes a free block, the logical block disassembling/reassembling unit 23 disassembles the logical block #1. In the disassembling processing, the logical block disassembling/reassembling unit 23 disassembles the logical block #1, and moves the physical block A, physical block B, physical block C, and physical block D which have constituted the logical block #1 to the disassembled block pool 53. Here, the physical block A, physical block B, physical block C, and physical block D are pooled in the disassembled block pool 53 according to the channels and banks. Further, in the disassembled block pool 53, degrees of wear of the physical blocks are classified, and the physical blocks are managed for each degree of wear.

Reassembly of a new logical block #X is carried out in the following manner.

The logical block disassembling/reassembling unit 23 searches the physical blocks in the disassembled block pool 53 for four physical blocks having programming time lengths (tPROGs) coincident with each other or similar to each other. Then, the logical block disassembling/reassembling unit 23 selects physical blocks having erasing time lengths coincident with each other or similar to each other one by one from the four pairs of channels/banks, and collects the selected four physical blocks to reassemble a new logical block #X. Physical blocks having programming time lengths (tPROGs) similar to each other mean physical blocks having programming time lengths belonging to the same range (same programming time range). It should be noticed that tPROG can take various values depending on the write operation of the NAND flash memory 5. More specifically, tPROG is dependent on the write voltage VPGM, write step-up voltage DVPGM, write voltage application time STCVPGM, and the like.

In FIG. 29, a case where the logical block #X is reassembled with a physical block E, physical block B, physical block C, and physical block H is exemplified.

It should be noted that although basically it is possible to measure the degree of wear of each of the physical blocks on the basis of only the programming time length, there can be sometimes a case where the degree of wear is hardly revealed in the programming time length. In this case, physical blocks having programming time lengths belonging to the same programming time range, and having erase counts (numbers of program/erase cycles) belonging to the same erase count range may be selected one by one from the pairs of channels/banks, and the logical block #X may be reassembled with the four selected physical blocks. Thereby, it is possible to not only equalize the programming time lengths of the physical blocks constituting the logical block #X but also equalize the erase counts (numbers of program/erase cycles) of the physical blocks constituting the logical block #X. Accordingly, even when the degree of wear is hardly revealed in the programming time length, it is possible to assemble a new logical block with physical blocks having degrees of wear similar to each other.

When no four physical blocks satisfying the reassembling condition of the logical block #X exist in the disassembled block pool 53, the logical block disassembling/reassembling unit 23 may temporarily suspend reassembly of the logical block #X. Then, after another logical block is disassembled, whereby some new physical blocks are added to the disassembled block pool 53, the logical block disassembling/reassembling unit 23 may try to reassemble the logical block #X.

Figure 30:
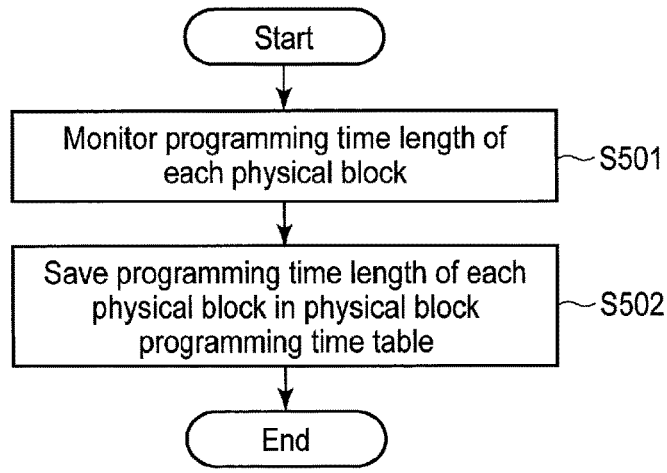
FIG. 30 is a flowchart illustrating a procedure for monitoring programming time length of each physical block, and saving a result of the monitoring, the procedure being executed by the memory system of the third embodiment.

The flowchart of FIG. 30 illustrates a procedure for monitoring the programming time length of each physical block, and saving a result of the monitoring to be executed by the controller 4.

The programming time monitor 22 monitors the programming time length of each physical block (step S501). At this time, the controller 4 obtains data on the programming time length of each physical block.

In step S501, for example, when a write operation of a certain logical block is executed, the programming time monitor 22 may monitor the programming time length of each of the physical blocks included in the logical block.

Then, the controller 4 saves the data on the programming time length of each physical block in the physical block programming time table 33F (step S502).

Figure 31:
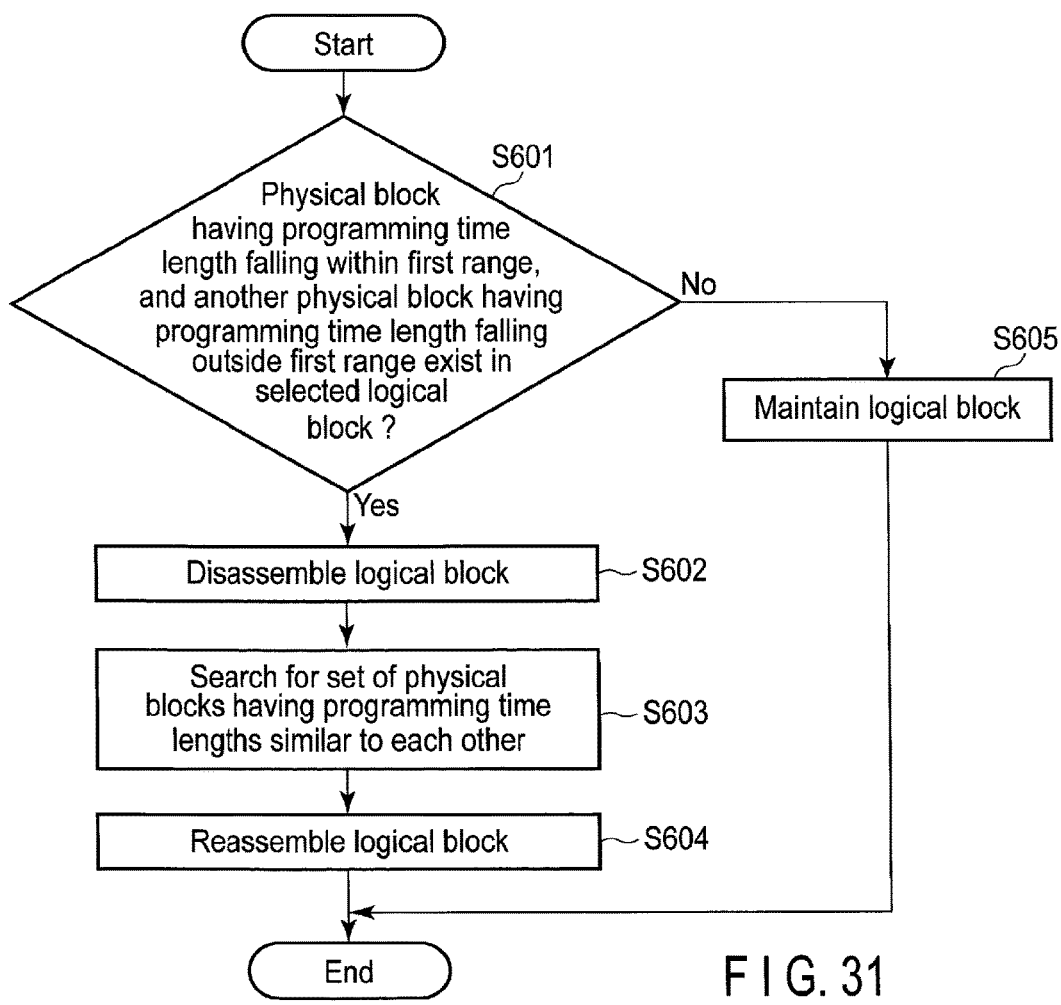
FIG. 31 is a flowchart illustrating a procedure for logical block disassembling and reassembling operations which are executed by the memory system of the third embodiment.

The flowchart of FIG. 31 illustrates a procedure for an operation of disassembling a logical block and operation of reassembling a new logical block.

The logical block disassembling/reassembling unit 23 selects one logical block which is an object to be processed, and determines whether or not a physical block having programming time length falling within a certain programming time range (first range), and a physical block having programming time length falling outside the programming time range (first range) exist in the selected logical block (step S601).

When the programming time lengths of all the physical blocks in the selected logical block fall within one programming time range (NO of step S601), the logical block disassembling/reassembling unit 23 maintains the logical block (step S605).

On the other hand, when the physical block having programming time length falling within a certain programming time range (first range), and the physical block having programming time length falling outside the programming time range (first range) exist in the selected logical block (YES of step S601), the logical block disassembling/reassembling unit 23 reserves the logical block to be disassembled, and disassembles the logical block at appropriate timing (step S602). In the processing of disassembling the logical block reserved for disassembly, the logical block disassembling/reassembling unit 23 disassembles the logical block, and moves all the physical blocks which have been included in the disassembled logical block to the disassembled block pool 53. All the physical blocks which have been included in the disassembled logical block are managed by the disassembled block pool 53. In the disassembled block pool 53, all the physical blocks may be managed according to the pairs of a channel and bank, and degrees of wear (here, according to the programming time ranges) as described in connection with FIG. 12 and FIG. 13.

In the processing of reassembling a new logical block, the logical block disassembling/reassembling unit 23 searches the physical blocks in the disassembled block pool 53 for a set of physical blocks having programming time lengths similar to each other (step S603). In this case, the logical block disassembling/reassembling unit 23 selects a plurality of physical blocks having programming time lengths belonging to the same range (i.e., having degrees of wear similar to each other), and respectively belonging to different pairs of channels/banks from the disassembled block pool 53. Upon discovery of a set of physical blocks appropriate for assembly of a logical block among the physical blocks in the disassembled block pool 53, the logical block disassembling/reassembling unit 23 reassembles a new logical block with the set of the physical blocks (step S604).

It should be noted that in steps S603 and S604, the logical block disassembling/reassembling unit 23 may search the physical blocks in the disassembled block pool 53 for a set of physical blocks having programming time lengths similar to each other and erase counts similar to each other, and may reassemble the new logical block with the set of the physical blocks having programming time lengths similar to each other and erase counts similar to each other.

Further, in the third embodiment too, as in the case of the second embodiment, some threshold values (three threshold values t11, t12, and t13 respectively corresponding to the erase count reference values PE1, PE2, and PE3) each of which has a limited effective range (effective erase count range) may be used.

More specifically, the logical block disassembling/reassembling unit 23 first carries out, as in the case of the second embodiment, classification processing of all the physical blocks in the NAND flash memory 5 according to their erase counts and programming time lengths. By the classification processing, the physical blocks may be classified into the following groups.

Group a: a group of physical blocks each of which has an erase count less than or equal to PE1, and programming time length longer than or equal to the threshold value t11

Group b: a group of physical blocks each of which has an erase count less than or equal to PE1, and programming time length less than the threshold value t11

Group c: a group of physical blocks each of which has an erase count greater than PE1 and less than or equal to PE2, and programming time length longer than or equal to the threshold value t12 (<t11)

Group d: a group of physical blocks each of which has an erase count greater than PE1 and less than or equal to PE2, and programming time length less than the threshold value t12

Group e: a group of physical blocks each of which has an erase count greater than PE2 and less than or equal to PE3, and programming time length longer than or equal to the threshold value t13 (<t12)

Group f: a group of physical blocks each of which has an erase count greater than PE2 and less than or equal to PE3, and programming time length less the threshold value t13

Further, the logical block disassembling/reassembling unit 23 refers to the physical block classification result to determine whether or not disassembly of a logical block is necessary for each logical block. In this case, the logical block disassembling/reassembling unit 23 first selects one logical block of an object to be processed, and determines whether or not disassembly of the selected logical block is necessary on the basis of the classification result of the physical blocks included in the selected logical block.

When the selected logical group is one of, for example, (1) a logical block in which a physical block belonging to the group a and physical block belonging to the group b exist, (2) a logical block in which a physical block belonging to the group c and a physical block belonging to the group d exist, (3) a logical block in which a physical block belonging to the group e and a physical block belonging to the group f exist, the logical block disassembling/reassembling unit 23 may determine that disassembly of the selected logical block is necessary.

Further, when a physical block belonging to one of the group a, group c, and group e, and a physical block belonging to one of the group b, group d, and group f exist in the physical blocks constituting the selected logical block too, the logical block disassembling/reassembling unit 23 may determine that disassembly of the logical block is necessary.

Next, dynamic wear leveling and static wear leveling to be executed in the third embodiment will be described below.

The wear leveling operation control unit 24 executes, on the basis of the programming time length corresponding to each of all the logical blocks, wear leveling for leveling the programming time lengths of the logical blocks.

First, dynamic wear leveling will be described.

The wear leveling operation control unit 24 selects a logical block having the longest programming time length (maximum tPROG) among logical blocks of the free block pool 52 (a set of logical blocks including no valid data) on the basis of the programming time length corresponding to each of the logical blocks, and preferentially allocates the selected logical block as a write destination logical block to which user data should be written.

By virtue of the execution of the dynamic wear leveling, a logical block having the long programming time length becomes easier to be selected as a write destination logical block. Thereby, it is possible to preferentially use a logical block having long programming time length for writing of user data (for example, write data received from the host 2, valid data to be moved from other logical blocks by garbage collection, or the like). Accordingly, the programming time length difference between a logical block having the maximum programming time length (maximum tPROG) and a logical block having the minimum programming time length (minimum tPROG) is reduced, and the programming time lengths of a plurality of logical blocks are equalized. Accordingly, it is possible to equalize the degrees of wear of a plurality of logical blocks.

Next, static wear leveling to be executed by the wear leveling operation control unit 24 will be described below.

The wear leveling operation control unit 24 selects a logical block having the longest programming time length (maximum tPROG) from the active block pool 51 (a set of logical blocks including valid data) on the basis of the programming time length corresponding to each of the logical blocks. Then, the wear leveling operation control unit 24 moves the valid data stored in the selected logical block to a logical block having programming time length shorter than the programming time of the selected logical block, and managed in the free block pool 52.

There is a strong possibility of the valid data stored in the logical block having the maximum programming time length (maximum tPROG) being cold data having a low frequency of update. Accordingly, by moving the cold data to another logical block having short programming time length; it becomes possible to utilize the logical block having the maximum tPROG for writing of other data.

The logical block (logical block having the maximum tPROG) having no longer valid data due to the movement of the valid data is moved from the active block pool 51 to the free block pool 52, and the logical block to which the valid data is written is moved to the active block pool 51.

By virtue of the execution of the static wear leveling, a logical block having the long programming time length becomes easier to be moved to the free block pool 52, and hence the logical block having the long programming time length becomes easier to be selected as a write destination logical block. Accordingly, the programming time length difference between a logical block having the maximum programming time length (maximum tPROG) and a logical block having the minimum programming time length (minimum tPROG) is reduced, and the programming time lengths of a plurality of logical blocks are equalized.

Accordingly, it is possible to equalize the degrees of wear of a plurality of logical blocks.

(Configuration Example of Host 2)

Figure 32:
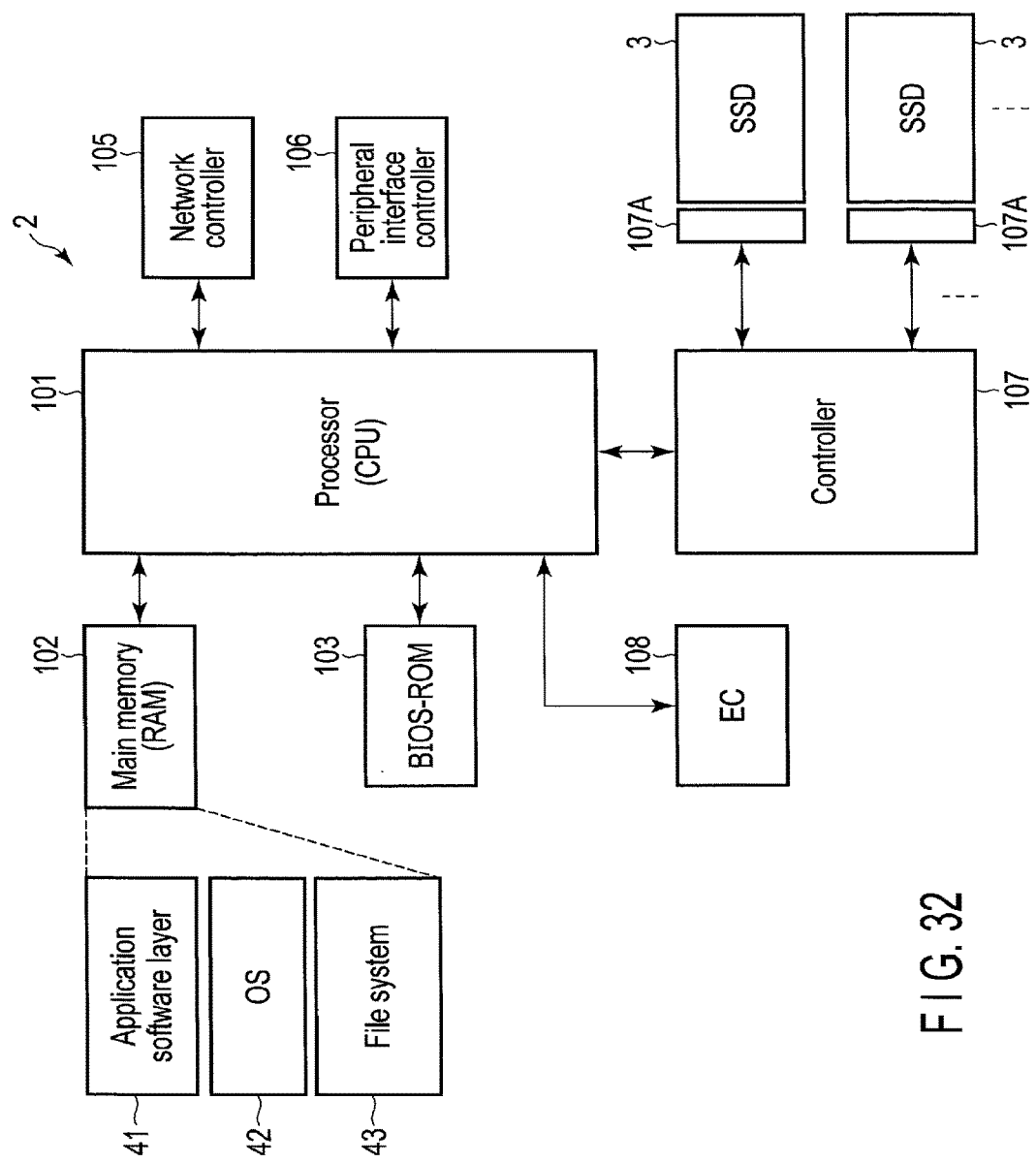
FIG. 32 is a block diagram illustrating a configuration example of a host.

FIG. 32 illustrates a hardware configuration example of an information processing device (computing device) functioning as the host 2 in the first, second or third embodiment.

This information processing device is realized as a computing device such as a server (for example, storage server). This information processing device includes a processor (CPU) 101, main memory 102, BIOS-ROM 103, network controller 105, peripheral interface controller 106, controller 107, embedded controller (EC) 108, and the like.

The processor 101 is a CPU configured to control an operation of each component of the information processing device. The processor 101 executes various programs loaded from one of a plurality of SSDs 3 into the main memory 102. The main memory 102 is constituted of a random access memory such as a DRAM. The programs to be executed by the processor 101 include the aforementioned application software layer 41, OS 42, and file system 43.

Further, the processor 101 also executes the basic input/output system (BIOS) stored in the BIOS-ROM 103 serving as a nonvolatile memory. The BIOS is a system program for hardware control.

The network controller 105 is a communication device such as a wired LAN controller and wireless LAN controller. The peripheral interface controller 106 is configured to execute communication with a peripheral device such as a USB device.

The controller 107 is configured to execute communication with devices which are respectively connected to a plurality of connectors 107A. A plurality of SSDs 3 may respectively be connected to the plurality of connectors 107A. The controller 107 is a SAS expander, PCIe Switch, PCIe expander, flash array controller, RAID controller or the like.

The EC 108 functions as a system controller configured to execute power management of the information processing device. The EC 108 turns on or turns off the information processing device according to an operation of the power switch to be carried out by the user. The EC 108 is realized as a processing circuit such as a one-chip microcontroller. The EC 108 may incorporate therein a keyboard controller configured to control an input device such as a keyboard (KB) or the like.

FIG. 33 illustrates a configuration example of the information processing device (computing device) including a plurality of SSDs 3 and host 2 in the first, second or third embodiment.

The information processing device is provided with a rack-mountable thin box-like housing 201. A large number of SSDs 3 may be arranged inside the housing 201. In this case, each SSD 3 may be detachably inserted in a slot provided in the front surface 201A of the housing 201.

A system board (mother board) 202 is arranged inside the housing 201. On the system board (mother board) 202, various electronic components including the CPU 101, main memory 102, network controller 105, and controller 107 are mounted. These electronic components function as the host 2.

As described above, according to the first to third embodiment, the erasing time length or programming time length of each of the physical blocks included in each of a plurality of logical blocks is monitored. Further, when one or more physical blocks having erasing time lengths (or programming time lengths) falling within a certain range, and other one or more physical blocks having erasing time lengths (or programming time lengths) falling outside the range exist in a certain logical block, the certain logical block is disassembled, and a new logical block is reassembled with a plurality of physical blocks having erasing time lengths (or programming time lengths) belonging to the same range.

Accordingly, when a physical block having poor characteristics exists in a certain logical block, it is possible to disassemble the logical block before the physical block having the poor characteristics becomes a bad block, reassemble a new logical block, and equalize the degrees of wear of all the physical blocks included in the logical block. Therefore, it is possible to equalize the degrees of wear of all the physical blocks belonging to the same logical block, and hence it is possible to delay the timing at which a physical block with poor characteristics included in the logical block becomes a bad block as compared with a case where the logical block in which a physical block having poor characteristics and physical blocks having excellent characteristics mixedly exist is continuously used as it is. Accordingly, it is possible to prevent the number of physical blocks to be treated as bad blocks from excessively increasing, and thereby prevent the lifetime of the SSD 3 from becoming short.

Modification Example

In the first to third embodiments described above, although the logical block disassembling condition is set on the basis of one of the erasing time length and programming time length of the physical block, the logical block disassembling condition may be set on the basis of both the erasing time length and programming time length.

For example, when it is desired that disassembly and reassembly of a logical block be positively carried out, the logical block may be disassembled when one of the following condition 1 or condition 2 is satisfied.

Condition 1: The erasing time length (tBERASE) of at least one of a plurality of physical blocks constituting a logical block falls within a certain time range, and erasing time length (tBERASE) of at least another physical block in the plurality of physical blocks falls outside the time range.

Condition 2: The programming time length (tPROG) of at least one of a plurality of physical blocks constituting a logical block falls within a certain time range, and programming time length (tPROG) of at least another physical block in the plurality of physical blocks falls outside the time range.

Further, when it is desired that the degree of wear of the physical block be obtained as accurately as possible, and disassembly and reassembly of the logical block be carried out on the basis of the obtained degree of wear, the logical block may be disassembled when both the abovementioned condition 1 and condition 2 are satisfied.

Alternatively, a function f(tBERASE, tPROG) having the erasing time length (tBERASE) and programming time length (tPROG) of the physical block as variables may be used. In this case, the logical block disassembling/reassembling unit 23 may first calculate a value of the function f corresponding to each physical block on the basis of the erasing time lengths and programming time lengths of the plurality of physical blocks constituting the logical block, and may disassemble the logical block when the following condition is satisfied.

Condition: The value of the function f corresponding to at least one of a plurality of physical blocks constituting a logical block belongs to a certain range, and value of the function f corresponding to at least another physical block in these physical blocks belongs to another range.

Further, tPROG may not necessarily be a value at the time of write completion, and a value in the middle of writing may be used for determination of disassembly of the logical block. Likewise, tBERASE may not necessarily be a value at the time of erase completion, and a value in the middle of erasing may be used for determination of disassembly of the logical block.

It should be noted that in the processing of determination whether or not the aforementioned condition or conditions are satisfied, some threshold values each of which has a limited effective range (limited effective erase count range) as described in connection with FIG. 22 may be used, or one or more threshold values having no limited effective ranges as described in connection with FIG. 16 may be used.

For example, for any one of determinations associated with the conditions (1) and (2), some threshold values each of which has a limited effective erase count range of the erase count may be used, or one or more threshold values having no limited effective ranges may be used. Alternatively, for determination associated with the condition (1), some threshold values each of which has a limited effective erase count range of the erase count may be used, and for determination associated with the condition (2), one or more threshold values having no limited effective ranges may be used. Alternatively, for determination associated with the condition (1), one or more threshold values having no limited effective ranges may be used, and for determination associated with the condition (2), some threshold values each of which has a limited effective erase count range of the ease count may be used.

It should be noted that in the first to third embodiments, the NAND flash memory is exemplified as a nonvolatile memory. However, the function of the first to third embodiments can also be applied to various other nonvolatile memories such as a Magnetoresistive Random Access Memory (MRAM), Phase change Random Access Memory (PRAM), Resistive Random Access Memory (ReRAM) or Ferroelectric Random Access Memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of physical blocks; and
   a controller circuit electrically connected to the nonvolatile memory, and configured to manage a plurality of logical blocks each of which includes a respective set of physical blocks among the plurality of physical blocks, and execute an erase operation in units of logical blocks, wherein
   the controller circuit is configured to:
      monitor at least one of an erasing time length and a programming time length of each of physical blocks included in a first logical block among the plurality of logical blocks;
      disassemble the first logical block among the plurality of logical blocks, the disassembling including de-allocating the physical blocks included in the first logical block to join a pool of de-allocated physical blocks, the pool of de-allocated physical blocks being a subset of the plurality of physical blocks, when both of a first physical block and a second physical block exist in the first logical block, the first physical block having an erasing time length or a programming time length falling within a first range specified by a first threshold value, and the second physical block having an erasing time length or a programming time length falling outside the first range;
      select, from the pool of de-allocated physical blocks, physical blocks having erasing time lengths or programming time lengths belonging to a same time length range;
      assemble a new logical block with the selected physical blocks; and
      execute, on the basis of an erasing time length or a programming time length corresponding to each of the plurality of logical blocks, wear leveling to level erasing time lengths or programming time lengths of the plurality of logical blocks.

2. The memory system of claim 1, wherein
   the selected physical blocks have erase counts belonging to a same erase count range.

3. The memory system of claim 1, wherein the controller circuit is further configured to:
   select a target logical block having a shortest erasing time length or a longest programming time length from a set of logical blocks each including no valid data; and
   preferentially allocate the selected target logical block as a write destination logical block to which user data is to be written.

4. The memory system of claim 1, wherein the controller circuit is further configured to:
   select a source logical block having a shortest erasing time length or a longest programming time length from a first set of logical blocks each including valid data; and
   move valid data stored in the selected source logical block to a destination logical block including no valid data and having an erasing time length longer than the erasing time length of the selected source logical block or a programming time length shorter than the programming time length of the selected source logical block.

5. A memory system comprising:
   a nonvolatile memory including a plurality of physical blocks; and
   a controller circuit electrically connected to the nonvolatile memory, and configured to manage a plurality of logical blocks each of which includes a respective set of physical blocks among the plurality of physical blocks, and execute an erase operation in units of logical blocks, wherein
   the controller circuit is configured to:
      monitor erasing time length of each of physical blocks included in a first logical block among the plurality of logical blocks;
      disassemble the first logical block among the plurality of logical blocks, the disassembling including de-allocating the physical blocks included in the first logical block to join a pool of de-allocated physical blocks, the pool of de-allocated physical blocks being a subset of the plurality of physical blocks, when both of a first physical block and a second physical block exist in the first logical block, the first physical block having an erasing time length falling within a first range specified by a first threshold value, and the second physical block having an erasing time length falling outside the first range;
      select, from the pool of de-allocated physical blocks, physical blocks having erasing time lengths belonging to a same time length range;
      assemble a new logical block with the selected physical blocks; and
      treat a physical block having an erasing time length longer than or equal to a second threshold value greater than the first threshold value as a defective block.

6. The memory system of claim 5, wherein
   the selected physical blocks have erase counts belonging to a same erase count range.

7. The memory system of claim 5, wherein
   the controller circuit is configured to execute, on the basis of an erasing time length corresponding to each of the plurality of logical blocks, wear leveling to level erasing time lengths of the plurality of logical blocks.

8. The memory system of claim 5, wherein
   the controller circuit is further configured to disassemble a logical block that includes the defective block.

9. The memory system of claim 5, wherein
   the defective block is not used for assembly of a new logical block.

10. A memory system comprising:
    a nonvolatile memory including a plurality of physical blocks; and
    a controller circuit electrically connected to the nonvolatile memory, and configured to manage a plurality of logical blocks each of which includes a respective set of physical blocks among the plurality of physical blocks, and execute an erase operation in units of logical blocks, wherein the controller circuit is configured to:

monitor at least one of an erasing time length and a programming time length of each of physical blocks included in a first logical block among the plurality of logical blocks;

when in the first logical block among the plurality of logical blocks, (a) both of a first physical block and a second physical block exist, or (b) both of a third physical block and a fourth physical block exist, or (c) both of the first physical block and the fourth physical block exist, or (d) both of the second physical block and the third physical block exist, disassemble the first logical block, the disassembling including de-allocating the physical blocks included in the first logical block to join a pool of de-allocated physical blocks, the pool of de-allocated physical blocks being a subset of the plurality of physical blocks;

the first physical block having an erase count less than or equal to a first erase count, and having an erasing time length or a programming time length falling within a first range specified by a first threshold value corresponding to the first erase count, the second physical block having an erase count less than or equal to the first erase count, and having an erasing time length or a programming time length falling outside the first range, the third physical block having an erase count greater than the first erase count and less than or equal to a second erase count, and having an erasing time length or a programming time length falling within a second range specified by a second threshold value corresponding to the second erase count, and the fourth physical block having an erase count greater than the first erase count and less than or equal to the second erase count, and having an erasing time length or a programming time length falling outside the second range;

select, from the pool of de-allocated physical blocks, physical blocks having erasing time lengths or programming time lengths belonging to a same time length range; and assemble a new logical block with the selected physical blocks.

11. The memory system of claim 10, wherein
the controller circuit is further configured to execute, on the basis of an erasing time length or a programming time length corresponding to each of the plurality of logical blocks, wear leveling to level erasing time lengths or programming time lengths of the plurality of logical blocks.

12. A memory system comprising:
a nonvolatile memory including a plurality of physical blocks; and
a controller circuit electrically connected to the nonvolatile memory, and configured to manage a plurality of logical blocks each of which includes a respective set of physical blocks among the plurality of physical blocks, and execute an erase operation in units of logical blocks, wherein the controller circuit is configured to:

monitor at least one of an erasing time length and a programming time length of each of physical blocks included in a first logical block among the plurality of logical blocks;

disassemble the first logical block among the plurality of logical blocks when a first physical block and a second physical block exist in the first logical block, the first physical block having an erasing time length or a programming time length falling within a first range specified by a first threshold value, and the second physical block having an erasing time length or a programming time length falling outside the first range; and execute, on the basis of an erasing time length or a programming time length corresponding to each of the plurality of logical blocks, wear leveling to level erasing time lengths or programming time lengths of the plurality of logical blocks, wherein the wear leveling includes:

selecting a source logical block having a shortest erasing time length or a longest programming time length from a set of logical blocks each including valid data; and moving valid data stored in the selected source logical block to a destination logical block including no valid data and having an erasing time length longer than the erasing time length of the selected source logical block or a programming time length shorter than the programming time length of the selected source logical block.

13. The memory system of claim 12, wherein the controller circuit is further configured to assemble a new logical block with a new set of physical blocks each having an erasing time length or a programming time length belonging to a same time length range.

14. The memory system of claim 13, wherein the controller circuit is further configured to
select the new set of the physical blocks from de-allocated physical blocks of the plurality of physical blocks.

* * * * *